(12) United States Patent
Feil et al.

(10) Patent No.: US 10,861,966 B2
(45) Date of Patent: *Dec. 8, 2020

(54) VERTICAL TRENCH POWER DEVICES WITH OXYGEN INSERTED SI-LAYERS

(71) Applicant: Infineon Technologies Austria AG, Villach (AT)

(72) Inventors: Thomas Feil, Villach (AT); Robert Haase, San Pedro, CA (US); Martin Poelzl, Ossiach (AT); Maximilian Roesch, St. Magdalen (AT); Sylvain Leomant, Poertschach am Woerthersee (AT); Bernhard Goller, Villach (AT); Ravi Keshav Joshi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/719,070

(22) Filed: Dec. 18, 2019

(65) Prior Publication Data

US 2020/0127135 A1    Apr. 23, 2020

Related U.S. Application Data

(63) Continuation of application No. 16/058,655, filed on Aug. 8, 2018, now Pat. No. 10,573,742.

(51) Int. Cl.
*H01L 29/78* (2006.01)
*H01L 21/28* (2006.01)
(Continued)

(52) U.S. Cl.
CPC .... *H01L 29/7813* (2013.01); *H01L 21/28167* (2013.01); *H01L 29/0856* (2013.01);
(Continued)

(58) Field of Classification Search
CPC ... H01L 21/28; H01L 21/281; H01L 21/2816; H01L 21/28167; H01L 29/08;
(Continued)

(56) References Cited

U.S. PATENT DOCUMENTS 6,404,007 B1    6/2002    Mo et al.
7,858,478 B2    12/2010   Hirler
(Continued)

FOREIGN PATENT DOCUMENTS

DE    102006002903 A1    8/2007
DE    102007044414 A1    3/2009
WO    2009079465 A1     6/2009

OTHER PUBLICATIONS

Shao, Lin, et al., "Boron diffusion in silicon: the anomalies and control by point defect engineering", Reports: A Review Journal, Materials Science and Engineering R 42, Aug. 11, 2003, pp. 65-114.

(Continued)

*Primary Examiner* — Monica D Harrison
(74) *Attorney, Agent, or Firm* — Murphy, Bilak & Homiller, PLLC

(57) ABSTRACT

A semiconductor device includes: a gate trench extending into a Si substrate; a body region in the Si substrate adjacent the gate trench; a source region in the Si substrate above the body region; a diffusion barrier structure adjacent a sidewall of the gate trench, the diffusion barrier structure including alternating layers of Si and oxygen-doped Si and a Si capping layer on the alternating layers of Si and oxygen-doped Si; and a channel region formed in the Si capping layer and which vertically extends along the sidewall of the gate trench. Corresponding methods of manufacture are also described.

20 Claims, 30 Drawing Sheets

(51) Int. Cl.
*H01L 29/08* (2006.01)
*H01L 29/10* (2006.01)
*H01L 29/40* (2006.01)
*H01L 29/423* (2006.01)
*H01L 29/51* (2006.01)
*H01L 29/66* (2006.01)

(52) U.S. Cl.
CPC ...... *H01L 29/1033* (2013.01); *H01L 29/1095* (2013.01); *H01L 29/407* (2013.01); *H01L 29/4236* (2013.01); *H01L 29/513* (2013.01); *H01L 29/66734* (2013.01)

(58) Field of Classification Search
CPC ... H01L 29/085; H01L 29/0856; H01L 29/10; H01L 29/103; H01L 29/1033; H01L 29/109; H01L 29/1095; H01L 29/40; H01L 29/407; H01L 29/42; H01L 29/423; H01L 29/4236; H01L 29/51; H01L 29/513; H01L 29/66; H01L 29/667; H01L 29/6673; H01L 29/66734; H01L 29/78; H01L 29/781; H01L 29/7813
USPC ........................................................ 257/330
See application file for complete search history.

(56) References Cited

U.S. PATENT DOCUMENTS

| | | | |
|---|---|---|---|
| 8,067,800 | B2 | 11/2011 | Hsieh |
| 10,510,836 | B1 | 12/2019 | Haase et al. |
| 10,573,742 | B1 * | 2/2020 | Feil ................. H01L 29/513 |
| 2004/0031987 | A1 | 2/2004 | Henninger et al. |
| 2004/0166636 | A1 | 8/2004 | Darwish |
| 2005/0167742 | A1 | 8/2005 | Challa et al. |
| 2007/0249142 | A1 | 10/2007 | Hisanaga |
| 2012/0061754 | A1 | 3/2012 | Hsieh |
| 2012/0064684 | A1 | 3/2012 | Hsieh |
| 2012/0074489 | A1 | 3/2012 | Hsieh |
| 2012/0187477 | A1 | 7/2012 | Hsieh |
| 2012/0280293 | A1 | 11/2012 | Pan |
| 2013/0168760 | A1 | 7/2013 | Hsieh |
| 2013/0313632 | A1 | 11/2013 | Schulze et al. |
| 2015/0270378 | A1 | 9/2015 | Konishi et al. |
| 2017/0263720 | A1 | 9/2017 | Hirler et al. |

OTHER PUBLICATIONS

Blank, Oliver, et al., "Oxygen Inserted Si-Layers for Reduced Contact Implant Outdiffusion in Vertical Power Devices", U.S. Appl. No. 16/058,631, filed Aug. 8, 2018.
Datta, Suman, "Mitigation of Intrinsic Vt Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018.
Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.
Poelzl, Martin, et al., "Oxygen Inserted Si-Layers for Reduced Substrate Dopant Outdiffusion in Power Devices", U.S. Appl. No. 16/058,593, filed Aug. 8, 2018.
Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28,-Mar. 2, 2017, pp. 1-6.
Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.
Xu, N., et al., "MOSFET Performance and Scalability Enhancement by Insertion of Oxygen Layers", 2012 International Electron Devices Meeting, San Francisco, CA, USA, Dec. 2012.

* cited by examiner

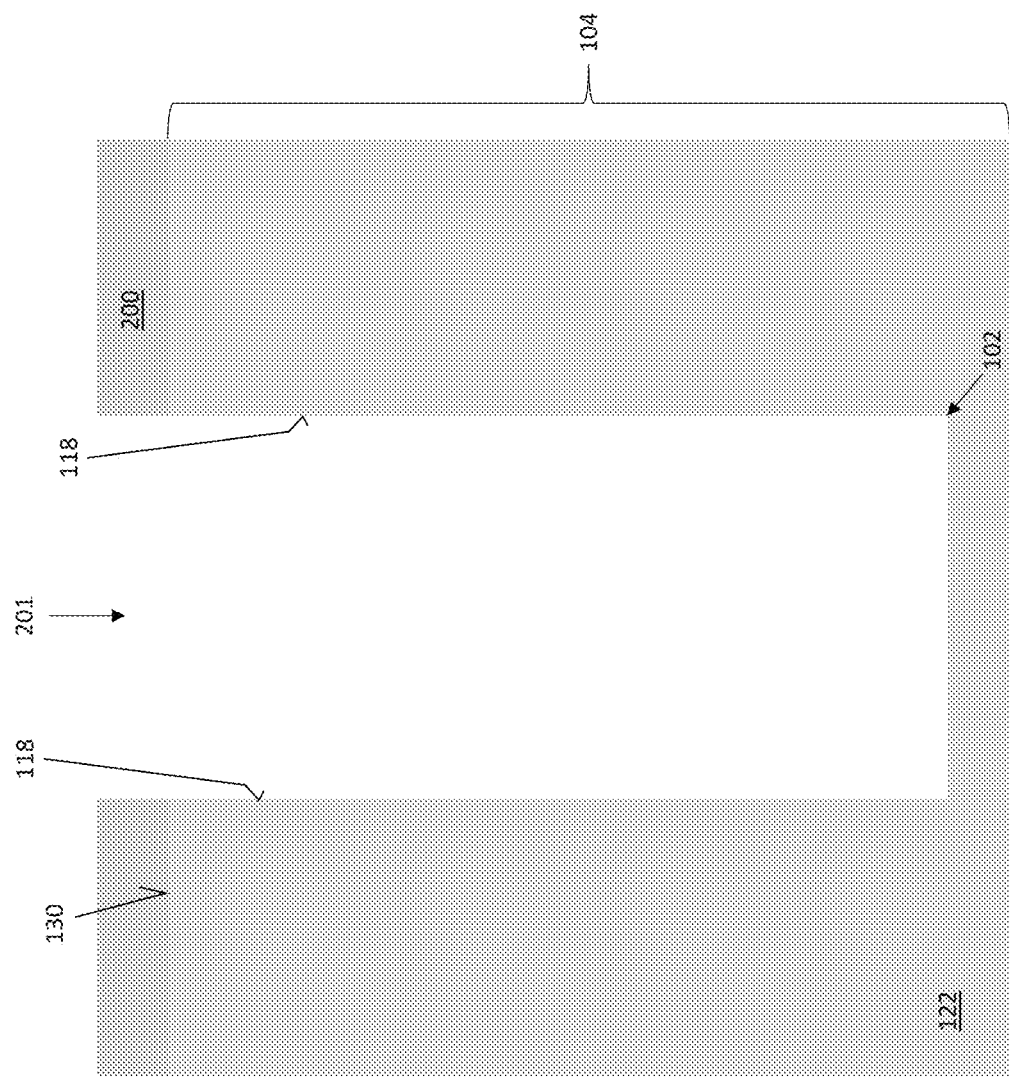

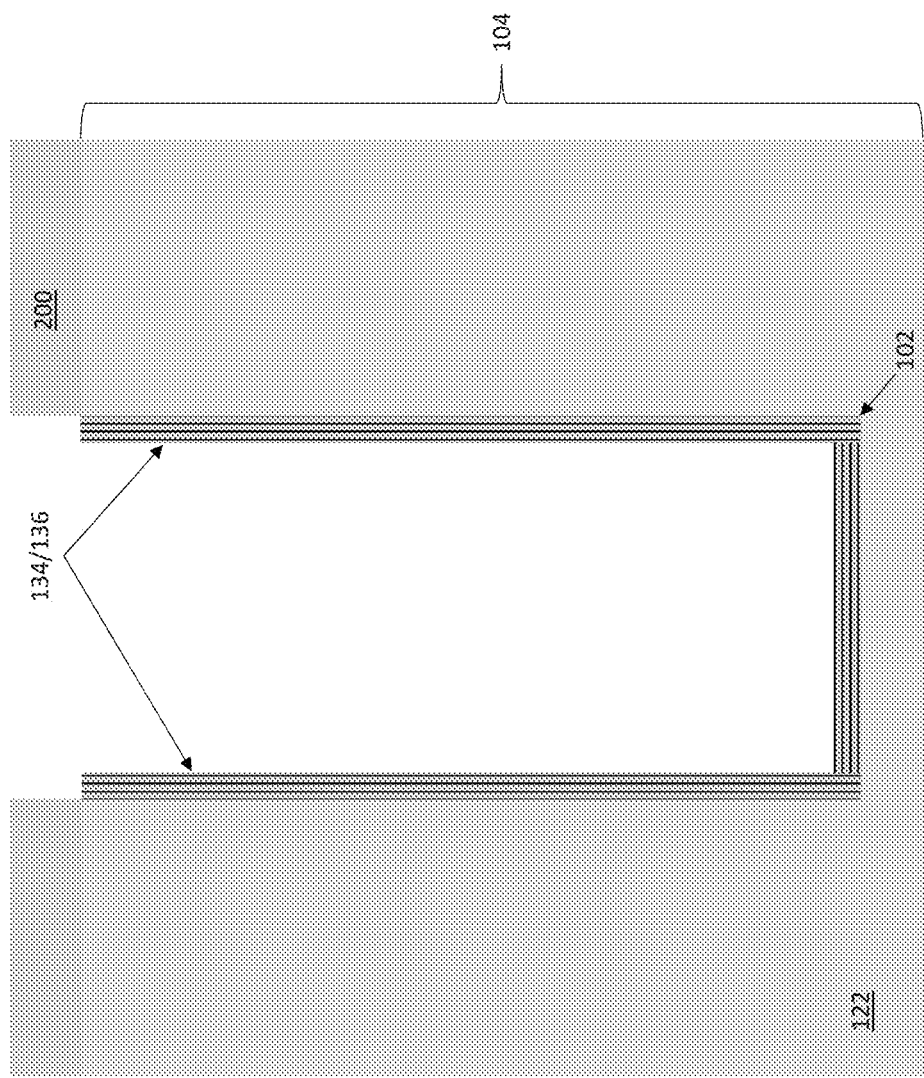

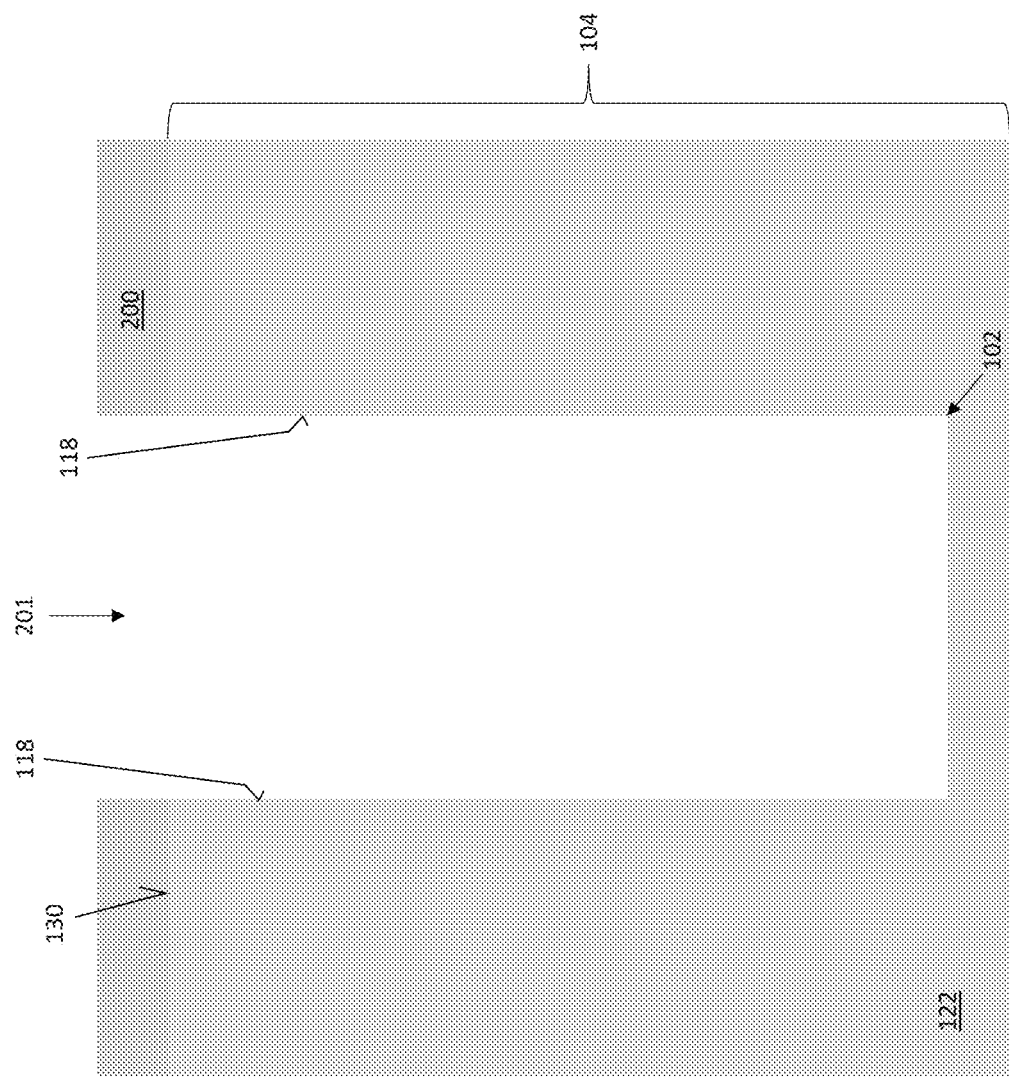

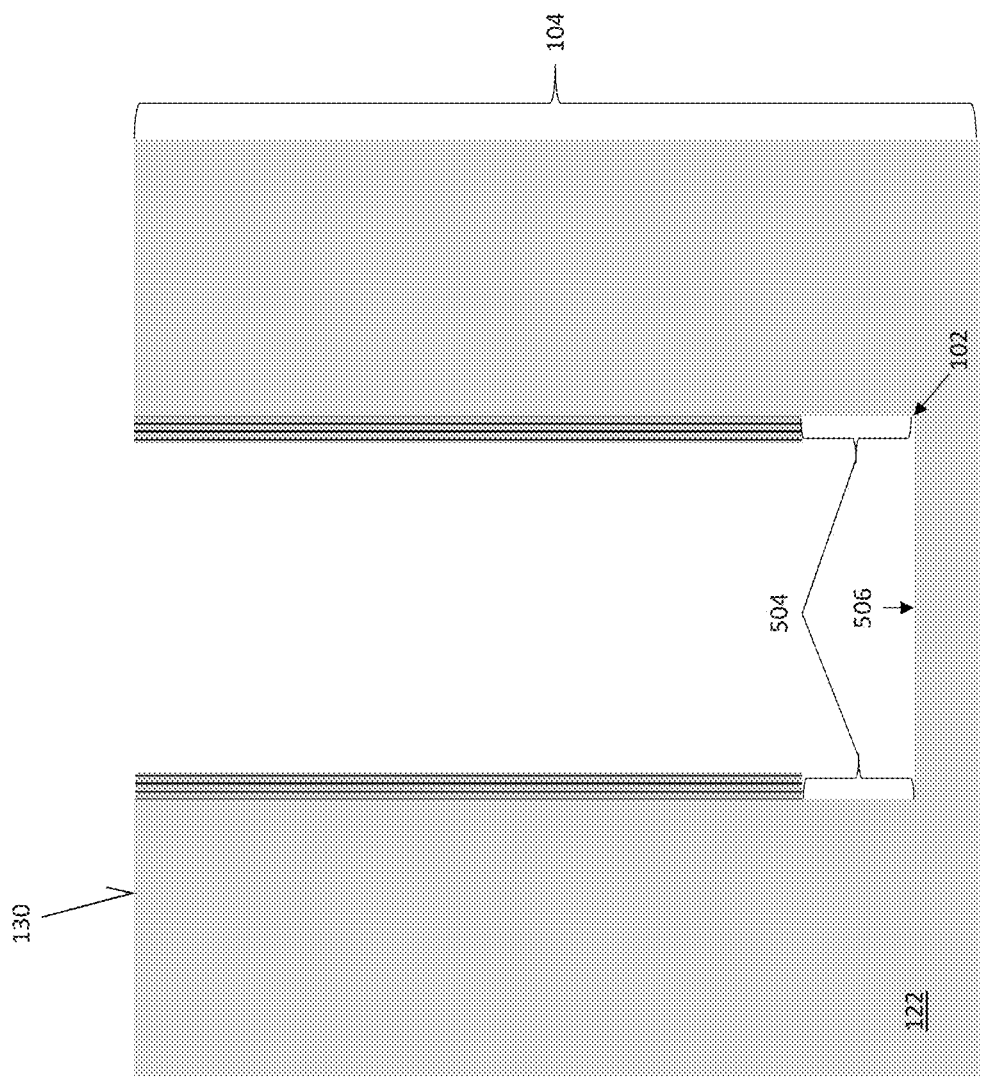

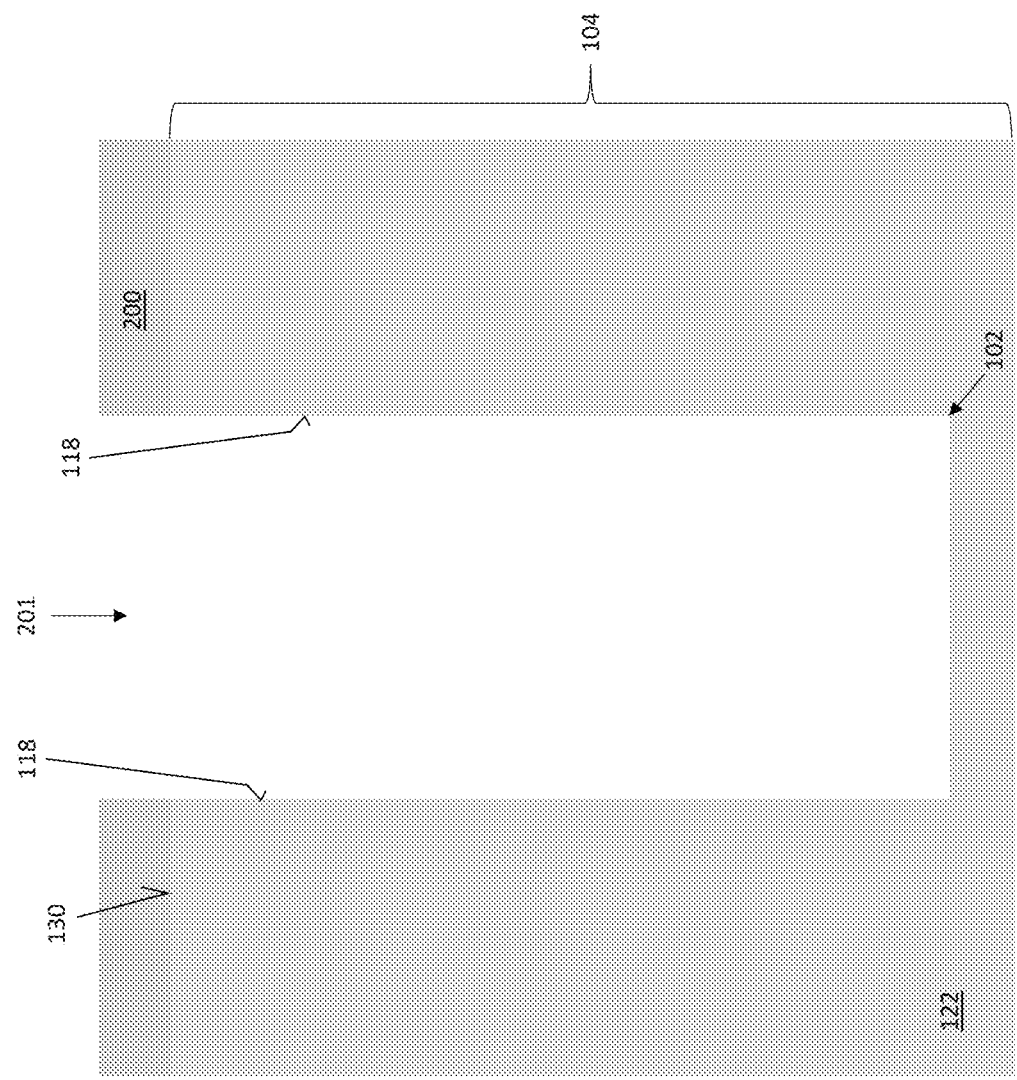

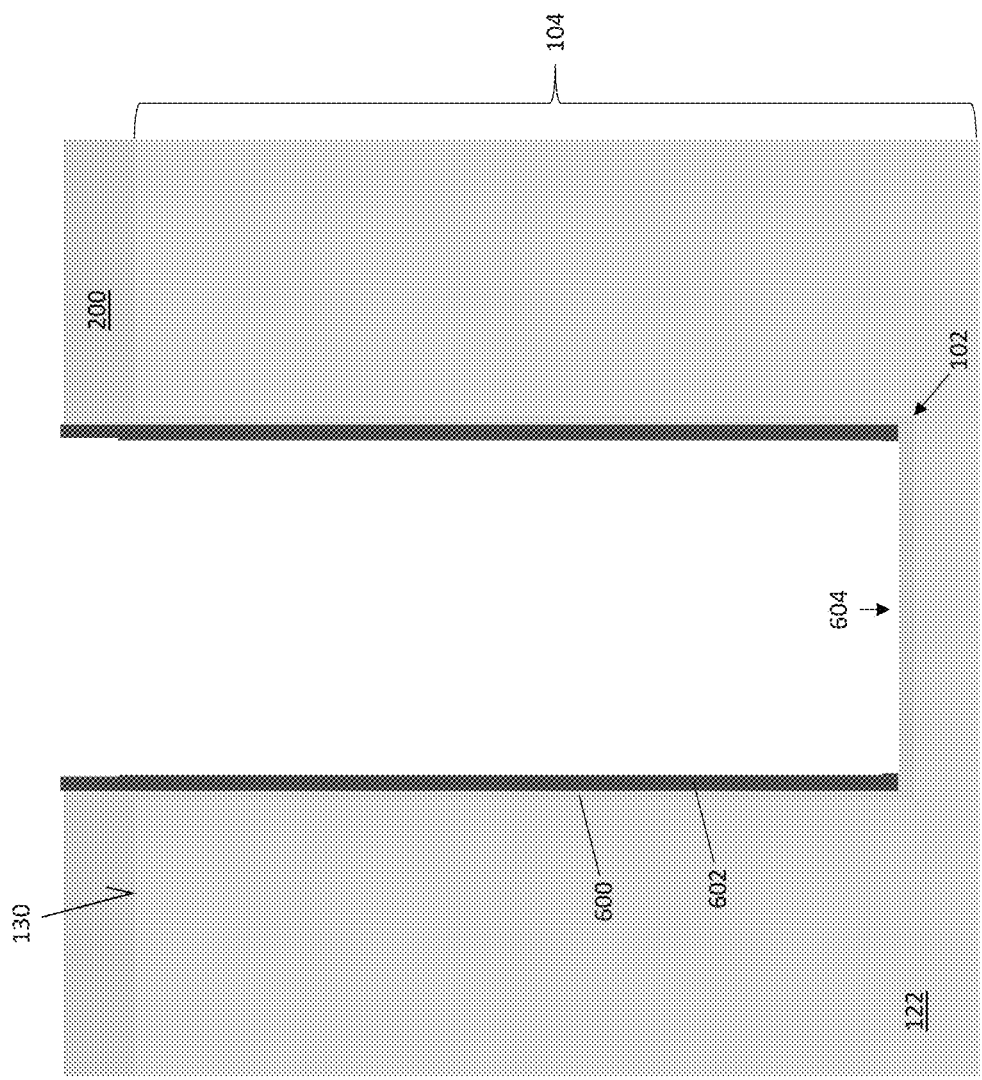

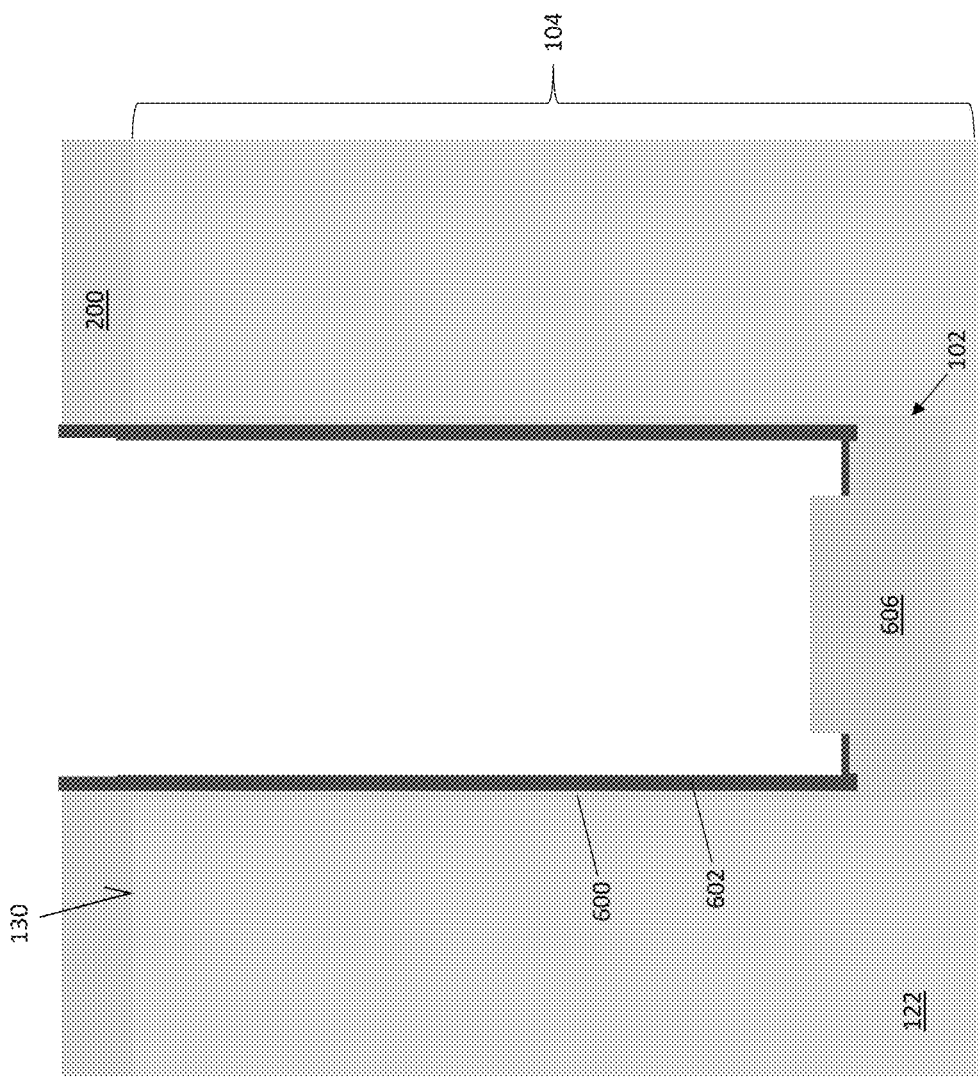

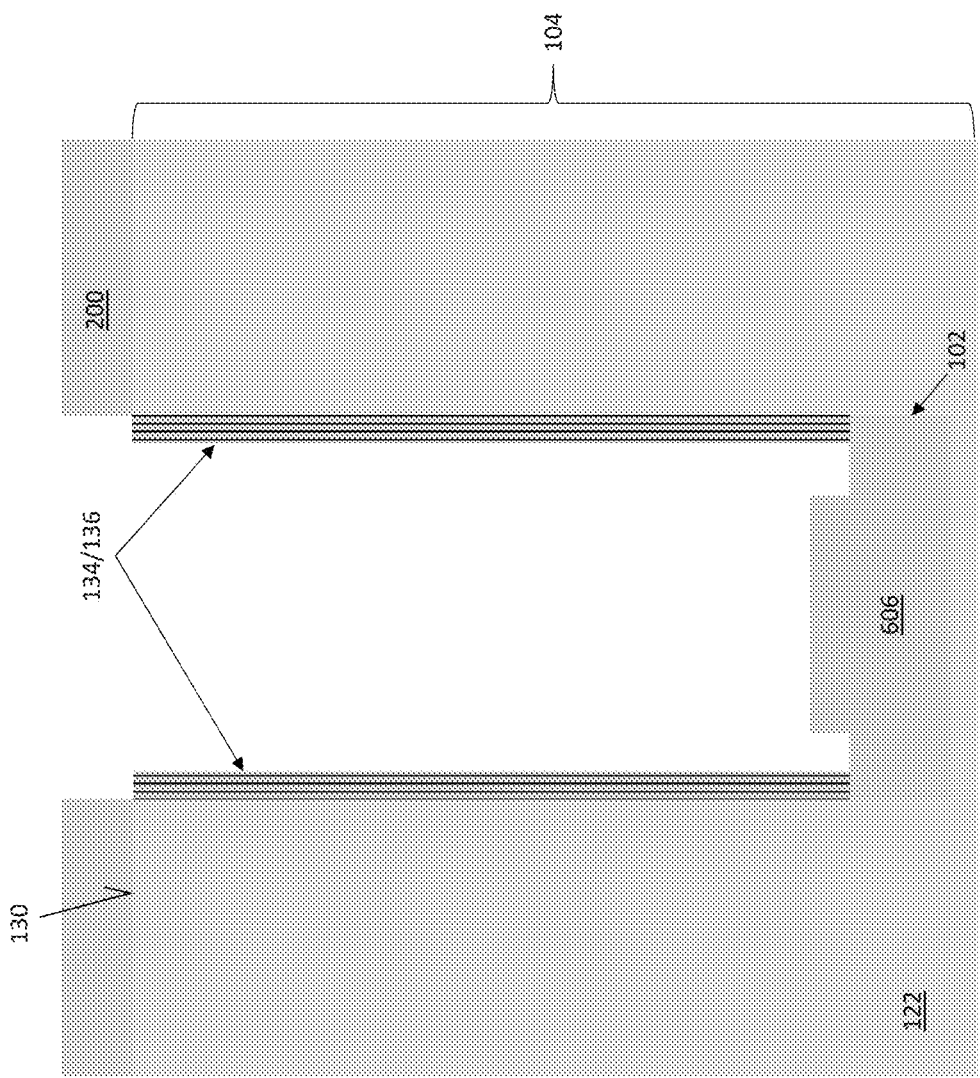

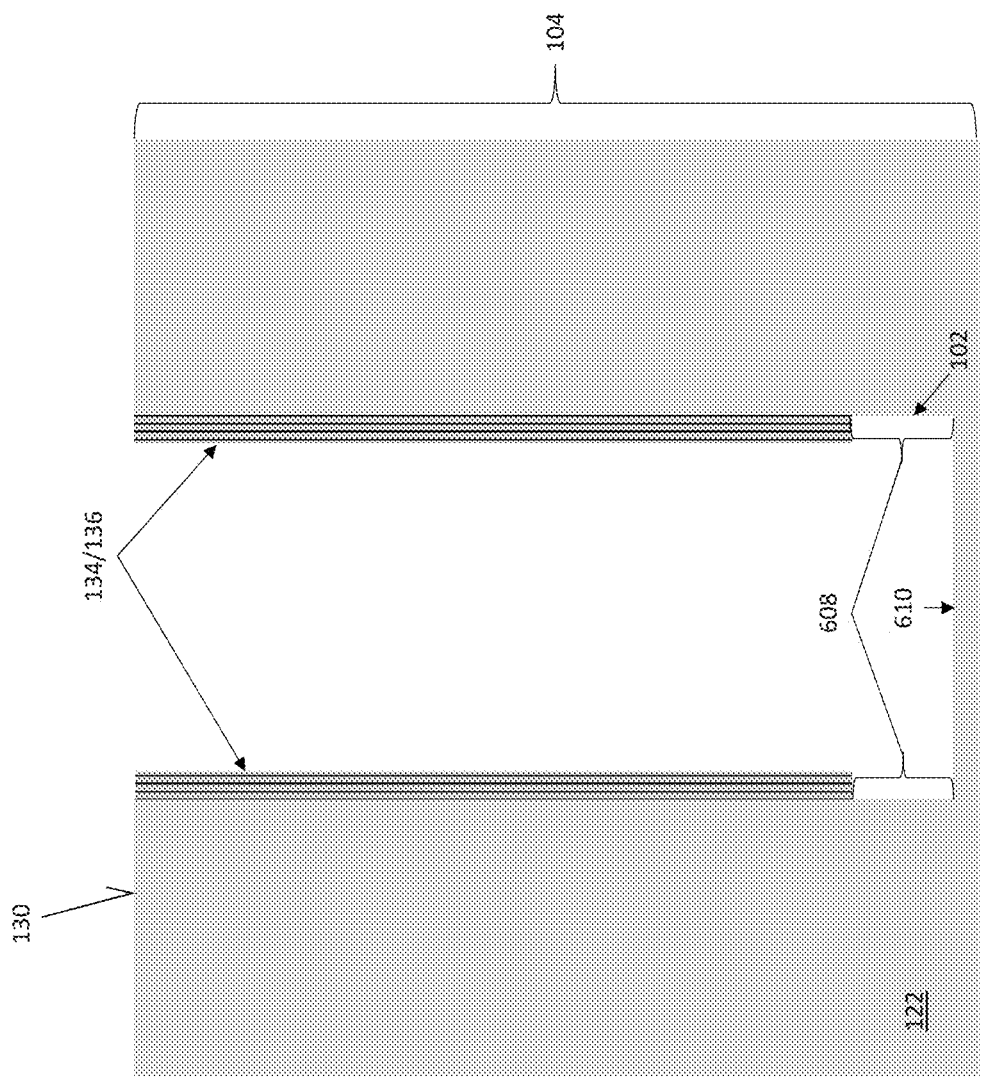

VERTICAL TRENCH POWER DEVICES WITH OXYGEN INSERTED SI-LAYERS

BACKGROUND

As the dimensions of trench-based transistors shrink, the influence of the highly-doped source/body contact on the net body doping near the channel region becomes more important. For wider lateral distribution of the source/body contact diffusion with 2-3 orders of magnitude higher doping levels compared to the body doping, Vth (threshold voltage) and RonA (on-state resistance) of the device increases. Increasing the distance between the source/body contact and the channel region causes depletion of the body at high drain voltages which can lead to high DIBL (drain-induced barrier lowering). Furthermore, the process window variation for both trench width and contact width as well as contact misalignment must become smaller to avoid these adverse effects (higher Vth, higher RonA and higher DIBL).

Hence, better control of the lateral out-diffusion of the source/body contact doping is desirable.

SUMMARY

According to an embodiment of a semiconductor device, the semiconductor device comprises: a gate trench extending into a Si substrate; a body region in the Si substrate adjacent the gate trench; a source region in the Si substrate above the body region; a contact trench extending into the Si substrate and filled with an electrically conductive material which contacts the source region at a sidewall of the contact trench and a highly doped body contact region at a bottom of the contact trench; a diffusion barrier structure formed along the sidewall of the gate trench, the diffusion barrier structure comprising alternating layers of Si and oxygen-doped Si and a Si capping layer on the alternating layers of Si and oxygen-doped Si; and a channel region formed in the Si capping layer and which vertically extends along the sidewall of the gate trench.

In an embodiment, the diffusion barrier structure may extend onto a front main surface of the Si substrate into which the gate trench and the contact trench are formed.

Separately or in combination, the diffusion barrier structure may extend along the front main surface of the Si substrate to the electrically conductive material which fills the contact trench.

Separately or in combination, the Si capping layer of the diffusion barrier structure may be present along the bottom of the gate trench but not the alternating layers of Si and oxygen-doped Si.

Separately or in combination, the gate trench may comprise a gate dielectric lining the sidewall and a bottom of the gate trench, a gate electrode disposed in an upper part of the gate trench, a field electrode embedded in a field dielectric in a lower part of the gate trench below the gate electrode, an insulating spacer vertically separating the gate electrode from the field electrode, and a silicon nitride layer separating the insulating spacer and the field dielectric from the gate dielectric.

According to an embodiment of a method of manufacturing a semiconductor device, the method comprises: forming a gate trench which extends into a Si substrate; forming a body region in the Si substrate adjacent the gate trench; forming a source region in the Si substrate above the body region; forming a contact trench which extends into the Si substrate and is filled with an electrically conductive material which contacts the source region at a sidewall of the contact trench and a highly doped body contact region at a bottom of the contact trench; forming a diffusion barrier structure along the sidewall of the gate trench, the diffusion barrier structure comprising alternating layers of Si and oxygen-doped Si and a Si capping layer on the alternating layers of Si and oxygen-doped Si; and forming a channel region in the Si capping layer and which vertically extends along the sidewall of the gate trench.

In an embodiment, forming the diffusion barrier structure may comprise: epitaxially growing the alternating layers of Si and oxygen-doped Si on the sidewall and a bottom of the gate trench; and epitaxially growing the Si capping layer on the alternating layers of Si and oxygen-doped Si.

Separately or in combination, the method may further comprises epitaxially growing the alternating layers of Si and oxygen-doped Si and the Si capping layer on a front main surface of the Si substrate into which the gate trench is formed.

Separately or in combination, the method may further comprise, after forming the diffusion barrier structure, implanting dopant species of the opposite conductivity type into the Si substrate to form the body and the source regions.

Separately or in combination, the method may further comprises forming a gate dielectric on the Si capping layer.

Separately or in combination, the gate dielectric may be formed by a deposition process, a thermal oxidation process, or both the deposition process and the thermal oxidation process.

Separately or in combination, the method may further comprise: forming a silicon nitride layer on the gate dielectric; forming a field dielectric on the silicon nitride layer; after forming the field dielectric, filling the gate trench with a first electrically conductive material; and recessing the first electrically conductive material to a first depth in the gate trench to form a field electrode.

Separately or in combination, the method may further comprise: removing the field dielectric above the field electrode to expose the silicon nitride layer in a region of the gate trench above the field electrode; and after removing the field dielectric above the field electrode, covering the field electrode with an insulating spacer.

Separately or in combination, covering the field electrode with the insulating spacer may comprise: after removing the field oxide above the field electrode, filling the gate trench with a dielectric material; and recessing the dielectric material to a second depth in the gate trench above the field electrode.

Separately or in combination, filling the gate trench with the dielectric material may comprise depositing a high-density-plasma oxide in the gate trench by chemical vapor deposition.

Separately or in combination, covering the field electrode with the insulating spacer may comprise forming a thermal oxide on the field electrode by a thermal oxidation process.

Separately or in combination, the method may further comprise: removing the silicon nitride layer above the insulating spacer; after removing the silicon nitride layer above the insulating spacer, filling the gate trench with a second electrically conductive material; and recessing the second electrically conductive material to a third depth in the gate trench to form a gate electrode.

Separately or in combination, the method may further comprise, after forming the gate electrode, implanting dopant species of the opposite conductivity type into the Si substrate to form the body and the source regions.

Separately or in combination, the contact trench may be formed after implanting the dopant species of the opposite conductivity type into the Si substrate.

Separately or in combination, the method may further comprise: removing the silicon nitride layer above the insulating spacer; after removing the silicon nitride layer above the insulating spacer, filling the gate trench with a second electrically conductive material; and recessing the second electrically conductive material to a third depth in the gate trench to form a gate electrode.

Separately or in combination, the method may further comprise: before forming the alternating layers of Si and oxygen-doped Si of the diffusion barrier structure, forming an insulating spacer in a lower part of the gate trench, the insulating spacer covering a bottom and a lower part of the sidewall of the gate trench to prevent formation of the alternating layers of Si and oxygen-doped Si of the diffusion barrier structure on the bottom and the lower part of the sidewall of the gate trench; and after forming the alternating layers of Si and oxygen-doped Si of the diffusion barrier structure, removing the insulating spacer from the lower part of the gate trench.

Separately or in combination, the method may further comprise after removing the insulating spacer from the lower part of the gate trench, epitaxially growing the Si capping layer of the diffusion barrier structure on the alternating layers of Si and oxygen-doped Si and on the bottom and the lower part of the sidewall of the gate trench.

Separately or in combination, forming the insulating spacer in the lower part of the gate trench may comprise: forming a high-density plasma oxide on the sidewall and the bottom of the gate trench, the high-density plasma oxide being thinner along the sidewall and thicker on the bottom of the gate trench; and removing the high-density plasma oxide from the sidewall of the gate trench.

Separately or in combination, forming the insulating spacer in the lower part of the gate trench may comprise: forming a silicon oxide layer on the sidewall and the bottom of the gate trench; forming a silicon nitride layer on the silicon oxide layer over the sidewall and the bottom of the gate trench; forming an opening in the silicon nitride layer at the bottom of the gate trench to expose the silicon oxide layer at the bottom of the gate trench; thermally oxidizing a region of the Si substrate below the exposed silicon oxide layer at the bottom of the gate trench; and removing the silicon nitride layer and the silicon oxide layer from the sidewall of the gate trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIG. 2A through 2M illustrate respective cross-sectional views of the trench-based semiconductor device shown in FIG. 1 during different stages of a manufacturing process.

FIG. 5A through 5F illustrate respective cross-sectional views of the trench-based semiconductor device shown in FIG. 4 during different stages of a manufacturing process for forming the diffusion barrier structure.

FIG. 6A through 6H illustrate respective cross-sectional views of the trench-based semiconductor device shown in FIG. 4 during different stages of another manufacturing process for forming the diffusion barrier structure.

DETAILED DESCRIPTION

Embodiments described herein control lateral out-diffusion of the source/body contact doping for trench-based transistors, allowing for narrower Vth, RonA and DIBL distributions for a given geometry variation for the highly-doped source/body contact and gate trench, and/or allowing for a lateral spacing reduction between the source/body contact and channel region of the device for given Vth, RonA and DIBL windows. The lateral out-diffusion of the source/body contact doping is better controlled by inserting a diffusion barrier structure which extends along at least part of the channel region of the device. The diffusion barrier structure comprises alternating layers of Si and oxygen-doped Si disposed between the highly doped source/body contact and the channel region of the device. The oxygen-doped Si layers of the diffusion barrier structure limit the lateral out-diffusion of the source/body contact doping, thereby controlling the lateral out-diffusion of the source/body contact doping in a direction towards the channel region. The diffusion barrier structure enables, for example, narrower Vth distribution for a narrow-trench MOSFET, or for a predetermined Vth distribution width, a smaller distance between the contact trench and the gate trench. Charge carrier mobility in the channel region may be increased, e.g., by up to 80% by incorporating the diffusion barrier structure. Gate leakage may also be reduced by incorporating the diffusion barrier structure, e.g., by up to 50%, and gate reliability improved compared to gate oxides grown on conventional silicon epitaxial layers. Described next in more detail are embodiments of semiconductor devices with such a diffusion barrier structure, and corresponding methods of manufacture.

Figure 1:
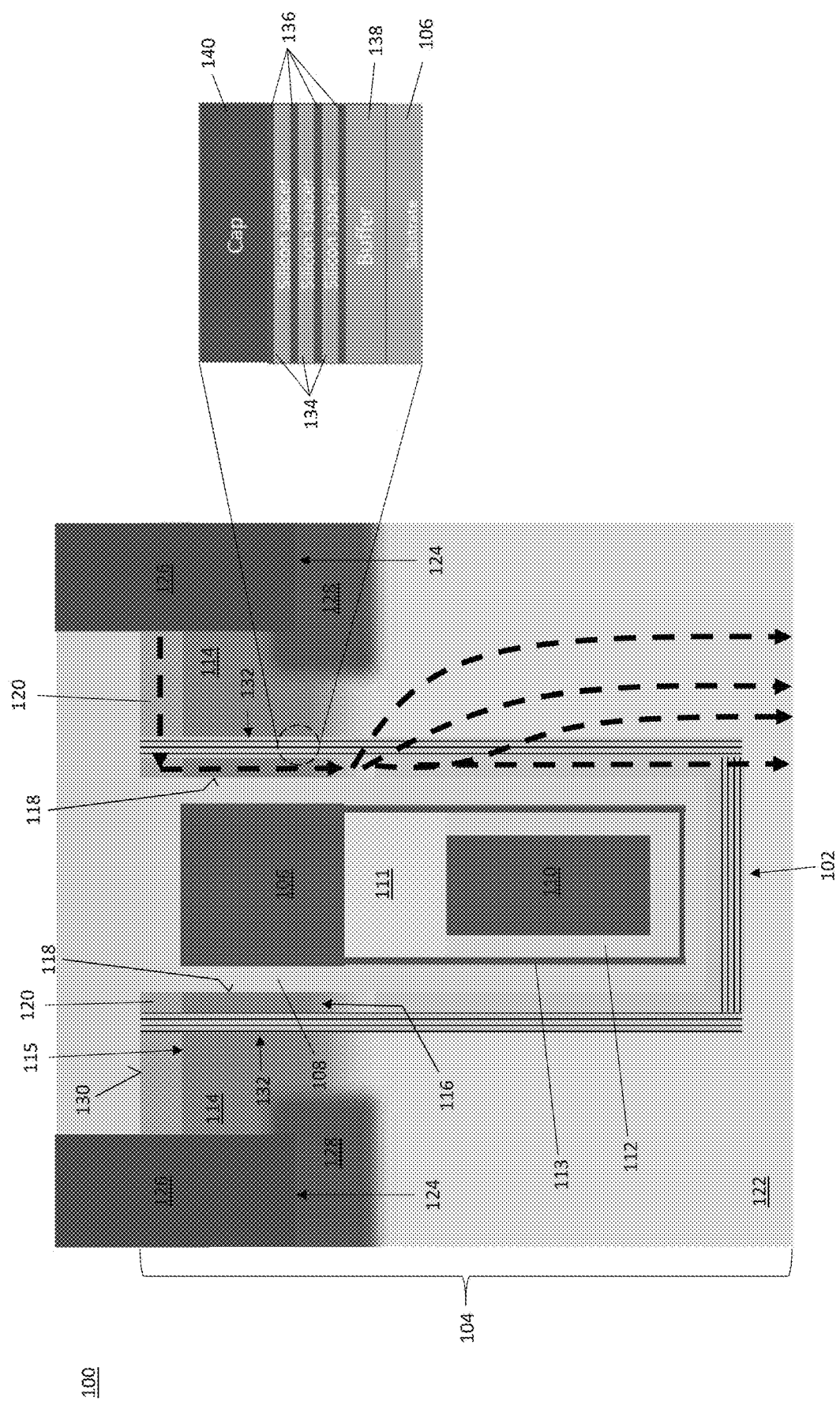
FIG. 1 illustrates a partial cross-sectional view of an embodiment of a trench-based semiconductor device having a diffusion barrier structure.

FIG. 1 illustrates a partial cross-sectional view of an embodiment of a trench-based semiconductor device 100. The semiconductor device 100 includes one or more gate trenches 102 extending into a Si substrate 104. A single gate trench 102 is shown in FIG. 1, however the semiconductor device 100 may include a plurality of gate trenches 102 with the same or similar construction but which are out of view. The Si substrate 104 may comprise one or more Si epitaxial layers grown on a base Si substrate. A gate electrode 106 disposed in each gate trench 102 is insulated from the surrounding semiconductor material by a gate dielectric 108. A field electrode 110 may be disposed in each gate trench 102 below the corresponding gate electrode 106, and insulated from the surrounding semiconductor material and the gate electrode 106 by a field dielectric 112. The gate and field dielectrics 108, 112 may comprise the same or different materials, and may have the same or different thicknesses. The field electrode 110 instead may be formed in a different trench separate from the gate trench 102, or omitted altogether depending on the type of semiconductor device. In one embodiment, an insulating spacer 111 such as a region of high-density plasma oxide vertically separates the gate electrode 106 from the field electrode 110, and a silicon nitride layer 113 separates the insulating spacer 111 and the field dielectric 112 from the gate dielectric 108 in a region of the gate trench 102 below the gate electrode 106.

The trench-based semiconductor device 100 may be a power semiconductor device such as a power MOSFET (metal-oxide-semiconductor field effect transistor), an IGBT (insulated gate bipolar transistor), etc. The trench-based semiconductor device 100 further includes a body region 114 formed in the Si substrate 104. The body region 114 includes a channel region 116 which vertically extends along the sidewall 118 of the corresponding gate trench 102. The semiconductor device 100 also includes a source region 120 formed in the Si substrate 104 above the body region 114. Vertical current flow through the channel region 116 is controlled by applying a gate potential to the gate electrode 106. A drain or collector region (not shown) is formed below a drift zone 122 of the device 100. Depending on the type of device, additional structures may be formed in the drift zone 122 and/or between the drift zone 122 and the drain/collector region. For example, charge compensation structures may be formed in the drift zone 122 and/or a field stop layer may be formed between the drift zone 122 and the drain/collector region in the case of an IGBT type device. Again, any type of semiconductor device with a trench gate may utilize the diffusion barrier teachings described herein.

The trench-based semiconductor device 100 further includes a contact trench 124 which extends into the Si substrate 104. The contact trench 124 is separated from each adjacent gate trench 102 by a portion of the source region 120 and a portion of the body region 114. The contact trench 124 is filled with an electrically conductive material 126 such as doped polysilicon, metal, etc. which contacts the source region 120 at the sidewall of the contact trench 124 and a highly doped body contact region 128 at the bottom of the contact trench 124.

The highly doped body contact region 128 at the bottom of the contact trench 124 has the same doping type as the body region 114, but at a higher concentration to provide good ohmic contact with the electrically conductive material 126 which fills the contact trench 124. For example, in the case of an n-channel device, the source region 120 and drift zone 122 are doped n-type and the body region 114, channel region 116 and highly doped body contact region 128 are doped p-type. Conversely, in the case of an p-channel device, the source region 120 and drift zone 122 are doped p-type and the body region 114, channel region 116 and highly doped body contact region 128 are doped n-type. In either case, the gate and contact trenches 102, 124 extend into the Si substrate 104 from the same front surface 130.

A diffusion barrier structure 132 extends along the sidewall 118 and bottom of the gate trench 102, and is disposed between the channel region 116 and the neighboring highly doped body contact region 128. The diffusion barrier structure 132 comprises alternating layers of Si 134 and oxygen-doped Si 136. The alternating layers of Si 134 and oxygen-doped Si 136 form an oxygen-doped silicon region grown by epitaxy. In an embodiment, the oxygen concentration for each oxygen-doped Si layer 136 is below 5e14 cm-3. Each oxygen-doped Si layer 136 may have a thickness in the atomic range (e.g. one or several atoms thick) or in the nanometer range to ensure sufficient crystal information for growing Si on the oxygen-doped Si layers 136. The alternating layers of Si 134 and oxygen-doped Si 136 may be realized by epitaxially growing Si layers alternating with oxygen layers respectively adsorbed on surfaces of the Si layers, e.g., with a particular limited thickness for the oxygen-doped Si layers 136 to ensure adequate Si growth.

FIG. 1 provides an exploded view of the diffusion barrier structure 132, which may also include a Si buffer layer 138 below the alternating layers of Si 134 and oxygen-doped Si 136, and a capping layer 140 of Si epitaxially grown on the alternating layers of Si 134 and oxygen-doped Si 136. The Si buffer layer 138 may be relatively thin, e.g., in the range of 2-5 nm thick. The Si buffer layer 138 may be grown after an implant or an etch step. The capping layer 140 provides high carrier mobility in this region of the device 100. The channel region 116 is formed in the Si capping layer 140 and vertically extends along the sidewall 118 of the gate trench 102. The buffer layer 138 may be omitted. The oxygen-doped Si layers 136 of the diffusion barrier structure 132 limit the lateral out-diffusion of the source/body contact doping, thereby controlling lateral out-diffusion from each highly doped body contact region 128 in a direction towards the channel region 116. The oxygen-doped Si layers 136 of the diffusion barrier structure 132 may also improve carrier mobility within the vertical channel region 116 of the device 100.

The oxygen-doped Si layers 136 of the diffusion barrier structure 132 may be formed by introducing oxygen partial monolayers to a Si lattice. The oxygen atoms are interstitially placed to minimize disruption to the Si lattice. Layers of Si atoms 134 separate adjacent oxygen partial monolayers 136. The alternating layers of Si 134 and oxygen-doped Si 136 may be formed by Si epitaxy with absorption of oxygen at different steps. For example, temperature and gaseous conditions can be controlled during the epitaxy process to form the partial oxygen monolayers 136. Oxygen may be introduced/incorporated between epitaxial layers 134 of Si, e.g. by controlling the introduction of an oxygen precursor into the epitaxy chamber. The resulting barrier barrier structure 132 includes monolayers 136 that comprise mainly Si but have a doped level or concentration level of oxygen alternating with standard epitaxial layers 134 of Si without oxygen. The diffusion barrier structure 132 also comprises a capping layer 140 of Si epitaxially grown on the alternating layers of Si 134 and oxygen-doped Si 136, or the capping layer 140 of Si may be omitted. The capping layer 140 of epitaxial Si is doped to form the channel region 116 of the device 100. In addition or alternatively, the diffusion barrier structure 132 may extend over an upper side 115 of the body region 114 and be disposed between the source region 120 and the body region 114 at the upper side of the body region 114.

Current flows through the high mobility channel region 116 of the semiconductor device 100 by applying a gate potential (represented by '-ve bias' in FIG. 2) to the gate electrode 106. The current pathway includes the source region 120, the channel region 116 and the drift zone 122. Current spreads outward from the channel region 116 as the current pathway vertically progresses into the drift zone 122, as indicated by the dashed lines in FIG. 1.

FIGS. 2A through 2M illustrate respective cross-sectional views of the trench-based semiconductor device 100 shown in FIG. 1 during different stages of a manufacturing process.

FIG. 2A shows the semiconductor device 100 after formation of the gate trench 102. The gate trench 102 may be etched into the Si substrate 104 using any common trench formation process such as applying a mask/insulating material 200 on the front main surface 130 of the Si substrate 104 and etching the gate trench 102 into the Si substrate 104 through an opening 201 in the mask 200.

FIG. 2B shows the semiconductor device 100 after the alternating layers of Si 134 and oxygen-doped Si 136 of the diffusion barrier structure 132 are epitaxially grown on the sidewall 118 and the bottom of the gate trench 102. According to this embodiment, the alternating layers of Si 134 and oxygen-doped Si 136 are epitaxially grown on the sidewall 118 and the bottom of the gate trench 102 after etching the gate trench 102 into the Si substrate 104 but before forming the gate electrode 106 and the gate dielectric 108 in the gate trench 102.

Figure 2C:
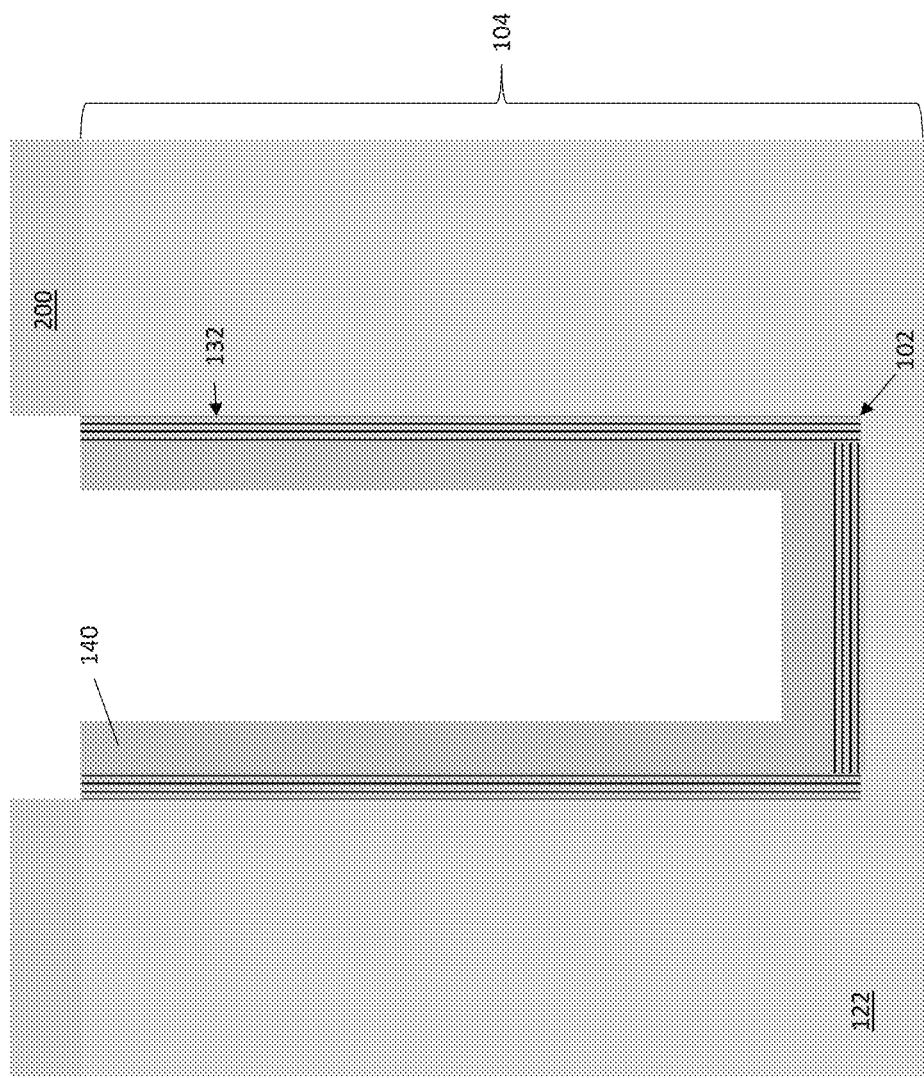

FIG. 2C shows the semiconductor device 100 after a capping layer 140 of Si is epitaxially grown on the alternating layers of Si 134 and oxygen-doped Si 136 to form the diffusion barrier structure 132. In one embodiment, the capping layer 140 of epitaxial Si has the same standard in situ doping concentration as the alternating layers of Si 134 and oxygen-doped Si 136 and may be doped later with a different dopant species and concentration to form the channel region 116 of the semiconductor device 100. Alternatively, the capping layer 140 may have a different in situ doping concentration compared to the alternating layers of Si 134 and oxygen-doped Si 136. In either case, the capping layer 140 may be used to implement the channel region 116 of the semiconductor device 100.

Figure 2D:
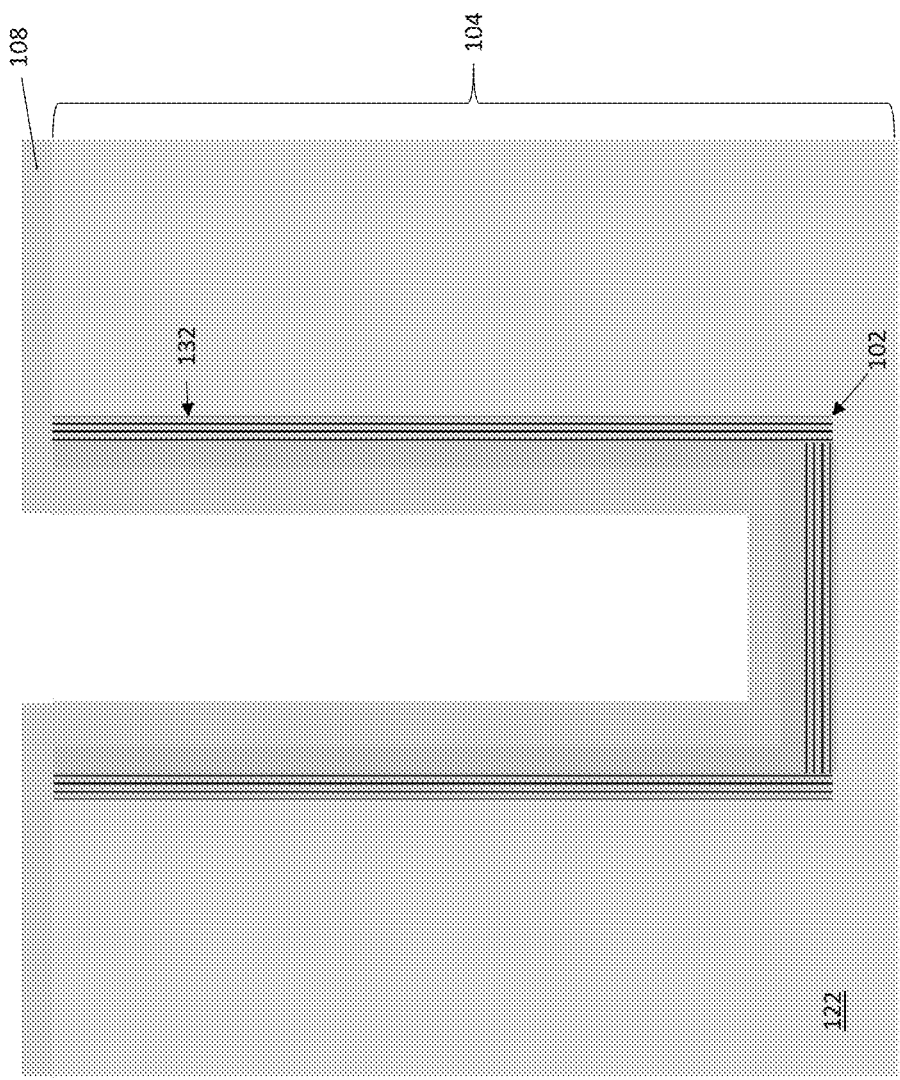

FIG. 2D shows the semiconductor device 100 after the gate dielectric 108 is formed along the diffusion barrier structure 132. Any common semiconductor manufacturing process for forming a gate dielectric may be used, e.g., such as a deposition process, a thermal oxidation process, or both a deposition process and a thermal oxidation process.

Figure 2E:
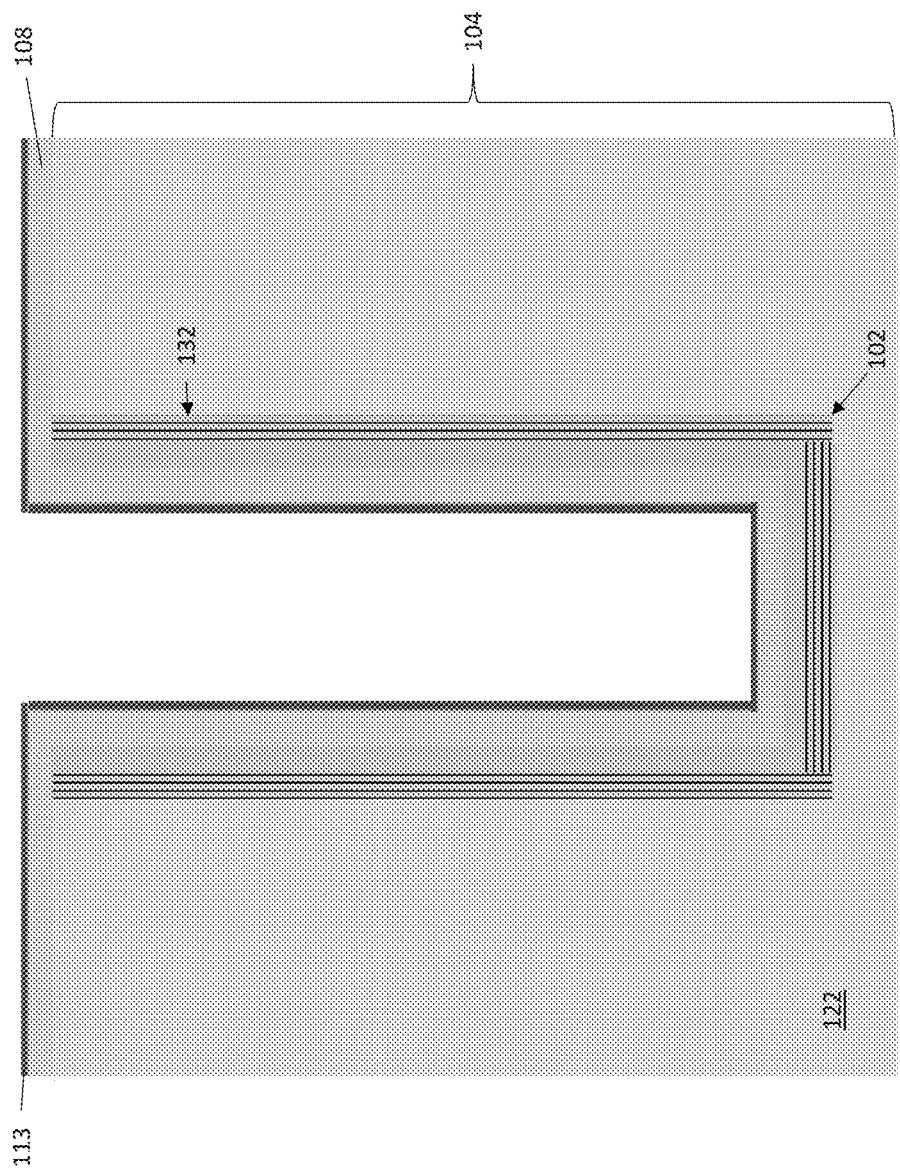

FIG. 2E shows the semiconductor device 100 after a silicon nitride layer 113 is formed on the gate dielectric 108. Any common semiconductor manufacturing process for forming a silicon nitride layer may be used, e.g., such as low pressure chemical vapor deposition (LPCVD), plasma-enhanced chemical vapor deposition (PECVD), etc.

Figure 2F:
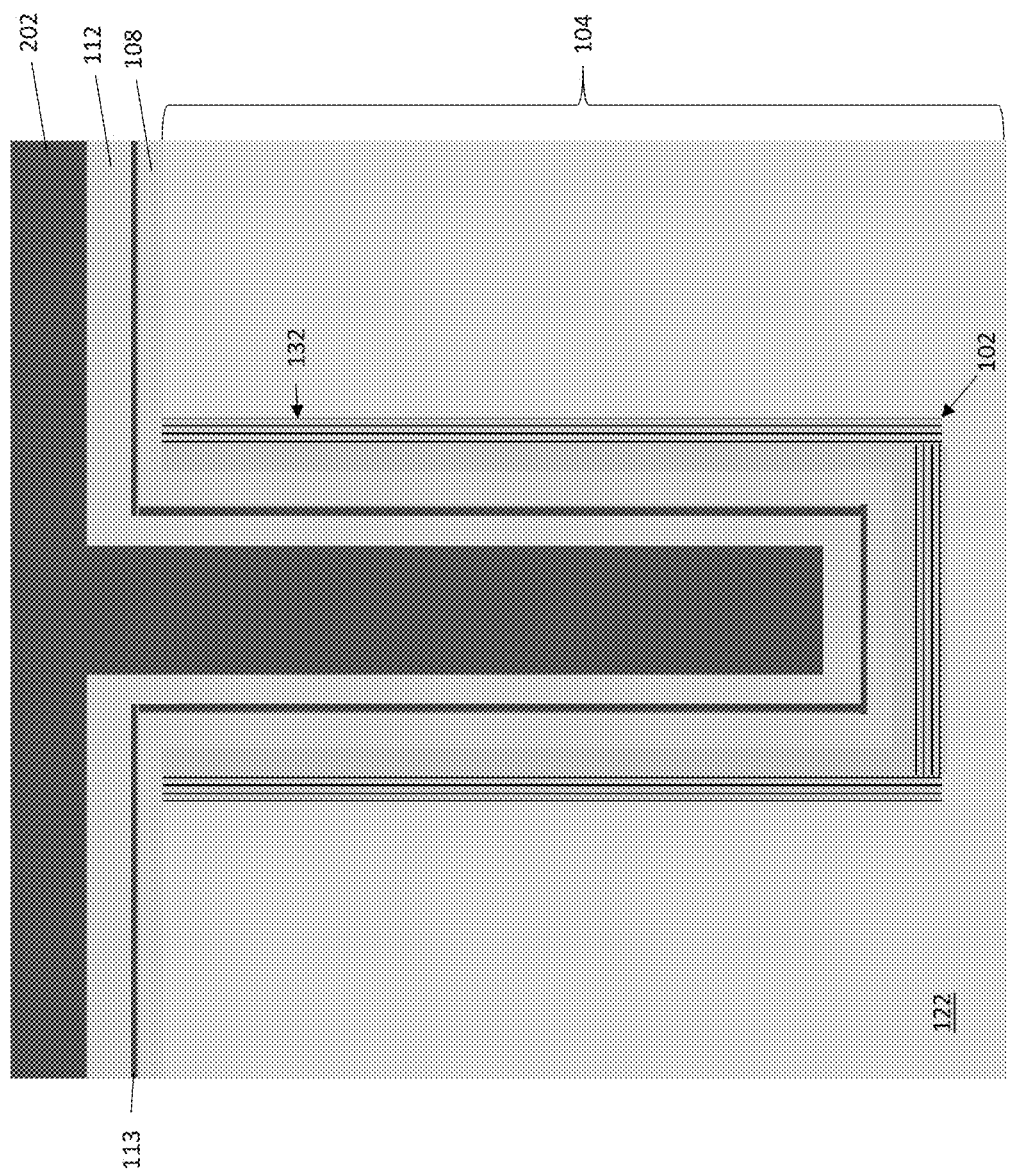

FIG. 2F shows the semiconductor device 100 after a field dielectric 112 such as a field oxide is formed on the silicon nitride layer 113, and after forming the field dielectric 1121, the gate trench 102 is filled with a first electrically conductive material 202 such as doped polysilicon, metal, etc.

Figure 2G:
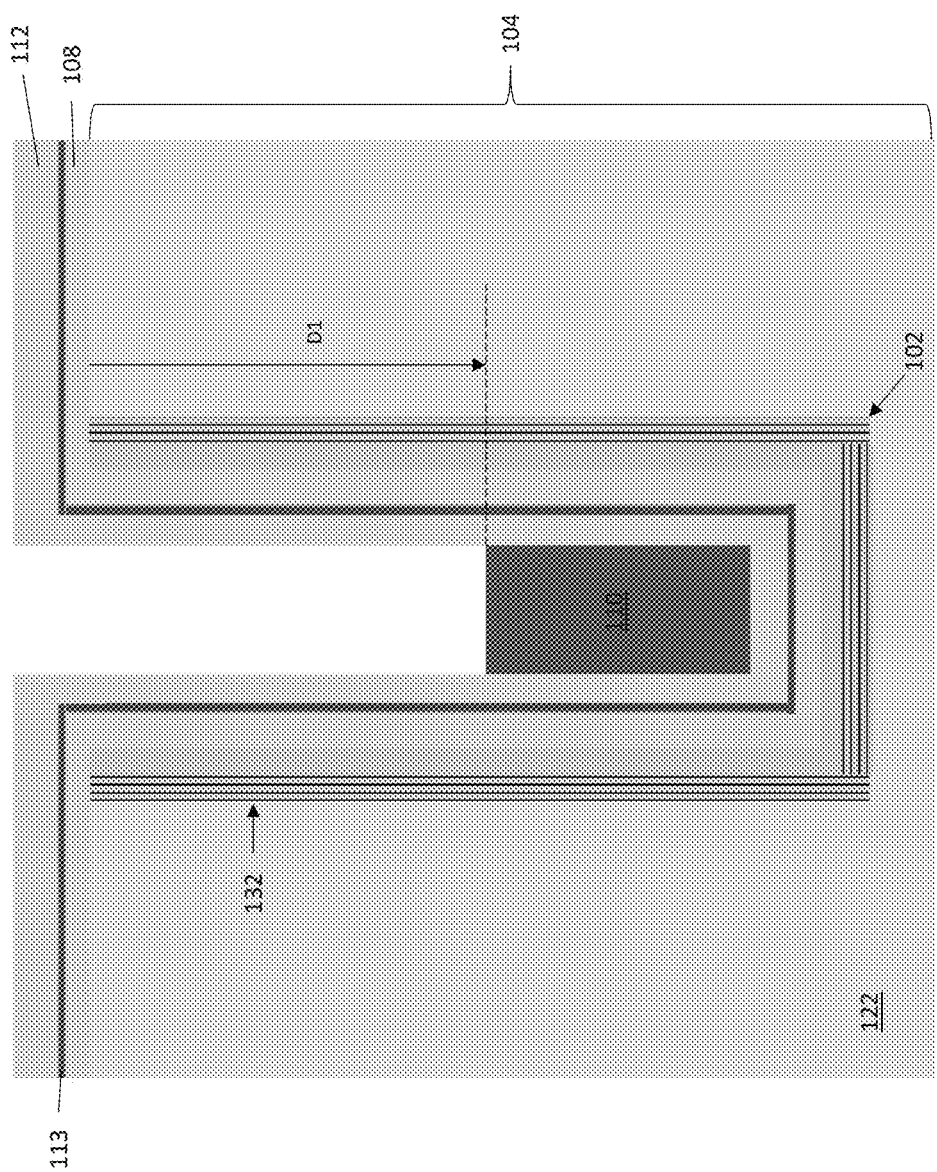

FIG. 2G shows the semiconductor device 100 after the first electrically conductive material 202 is recessed to a first depth D1 in the gate trench 102 to form the field electrode 110. Any common semiconductor manufacturing process for recessing an electrode material in a trench may be used, e.g., such as plasma etching, etc.

Figure 2H:
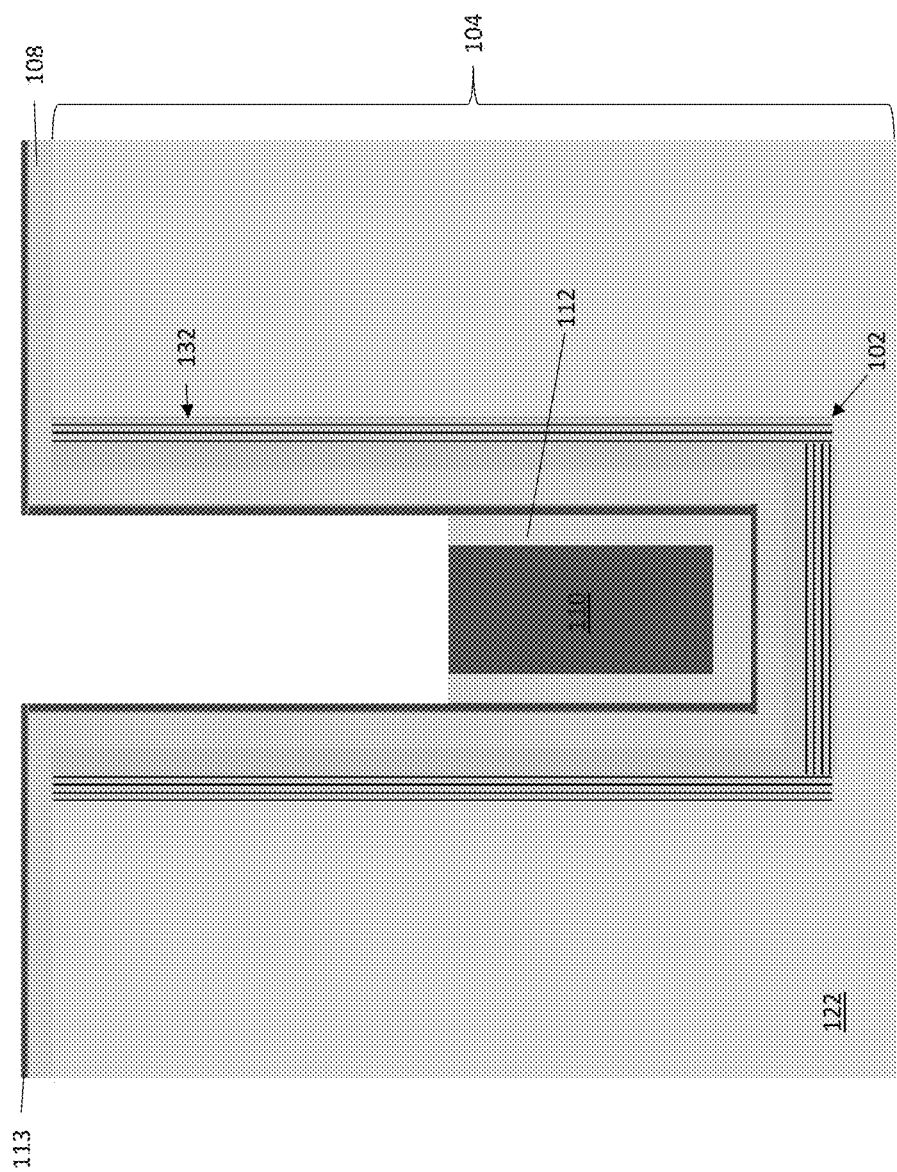
Figure 21:
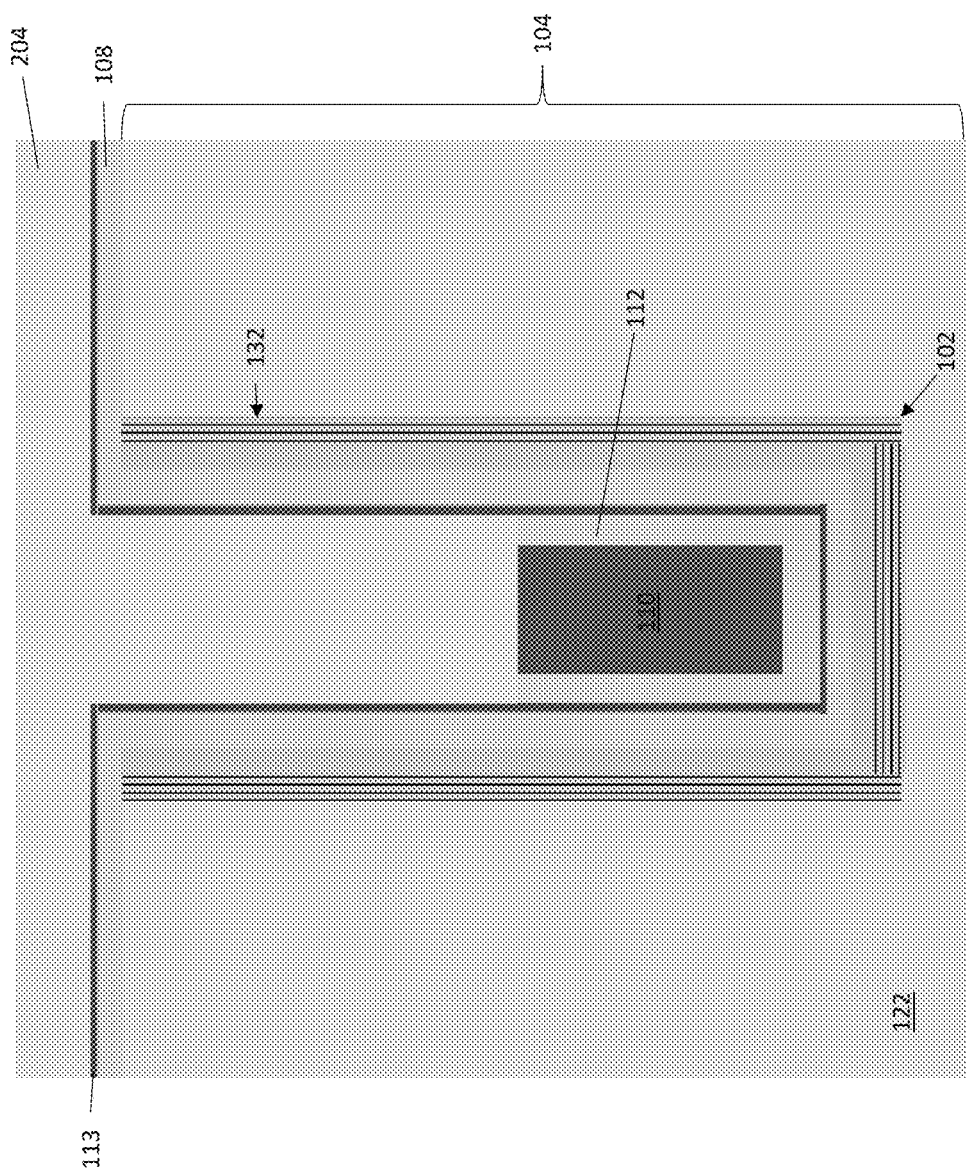

FIG. 2H shows the semiconductor device 100 after the field dielectric 112 is removed from the gate trench 102 above the field electrode 110 to expose the silicon nitride layer 113 in a region of the gate trench 102 above the field electrode 110. Any common semiconductor manufacturing process for removing a field dielectric from a trench may be used, e.g., such as HF etching, etc.

FIG. 2I shows the semiconductor device 100 after the gate trench 102 is filled with a dielectric material 204. In one embodiment, the gate trench 102 is filled with a silicon-based dielectric such as silicon oxide using a high-density plasma chemical vapor deposition (HDP CVD) process. Other processes may be used to produce a void-free gate trench 102, such as a multistep deposition/etch process, a spin-on dielectric process, etc.

Figure 2J:
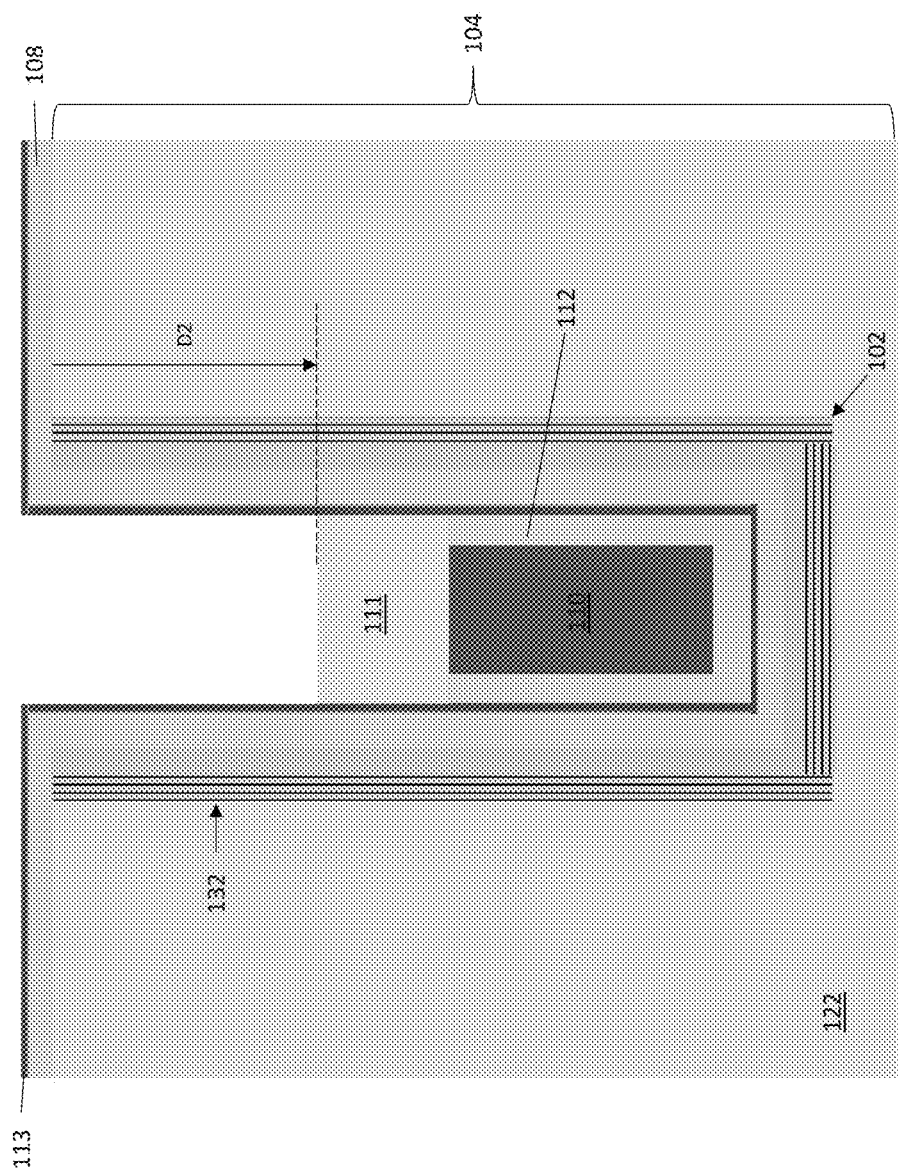

FIG. 2J shows the semiconductor device 100 after the dielectric material 204 is recessed to a second depth D2 in the gate trench 102 above the field electrode 110, wherein D2<D1. Any common semiconductor manufacturing process for recessing dielectric material in a trench may be used, e.g., such as HF etching in the case of oxide, etc. The part of the dielectric material 204 that remains in the gate trench 102 forms an insulating spacer 111 which covers the field electrode 110. Instead, of forming the insulating spacer 111 from HDP oxide, the insulating spacer 111 instead may be a thermal oxide. In this case, the oxygen-doped Si layers 136 of the diffusion barrier structure 132 can be protected during the thermal oxidation process by using a lower thermal oxidation temperature than what is commonly used to form a thermal oxide.

Figure 2K:
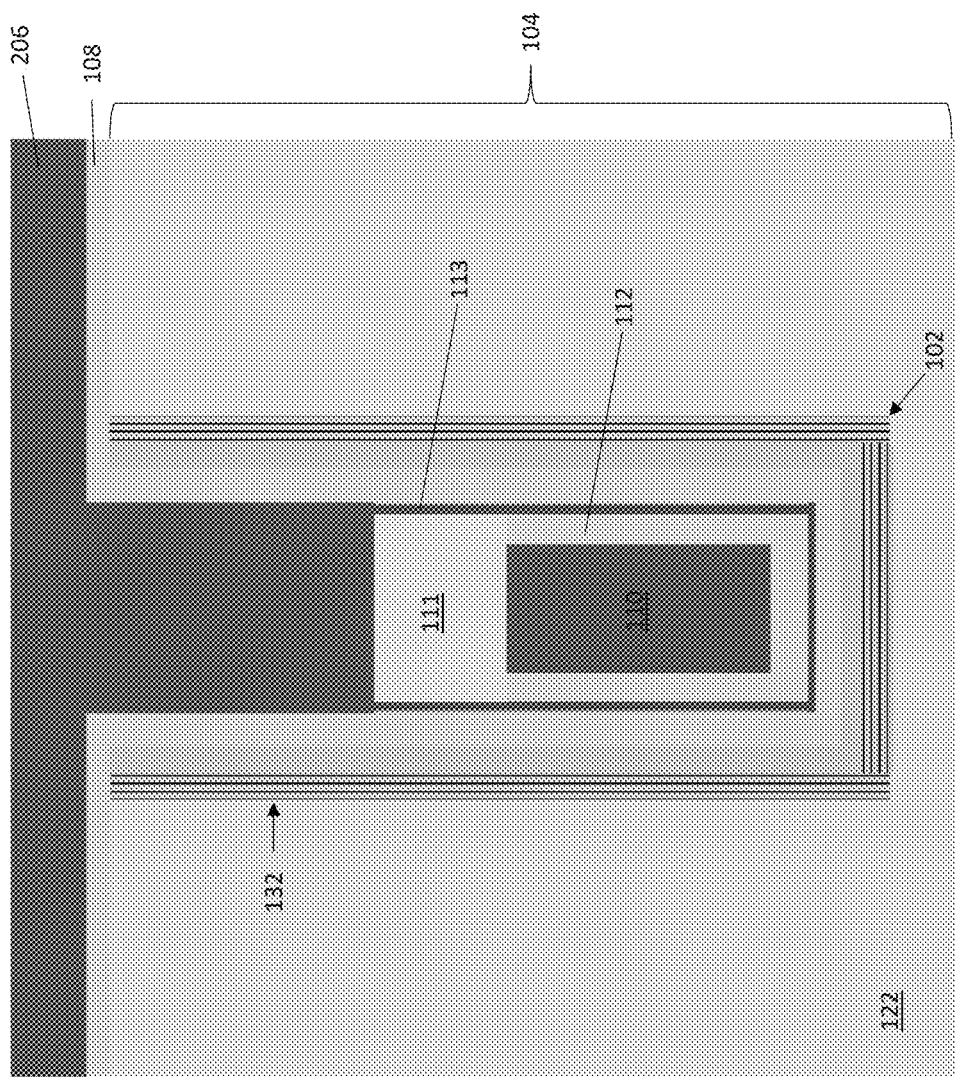

FIG. 2K shows the semiconductor device 100 after the silicon nitride layer 113 is removed from the gate trench 102 above the insulating spacer 111. Any common semiconductor manufacturing process for removing silicon nitride from a trench may be used, e.g., such as wet etching, plasma etching, etc. After removing the silicon nitride layer 113 above the insulating spacer 111, the gate trench 102 is filled with a second electrically conductive material 206 such as doped polysilicon, a metal, etc.

Figure 2L:
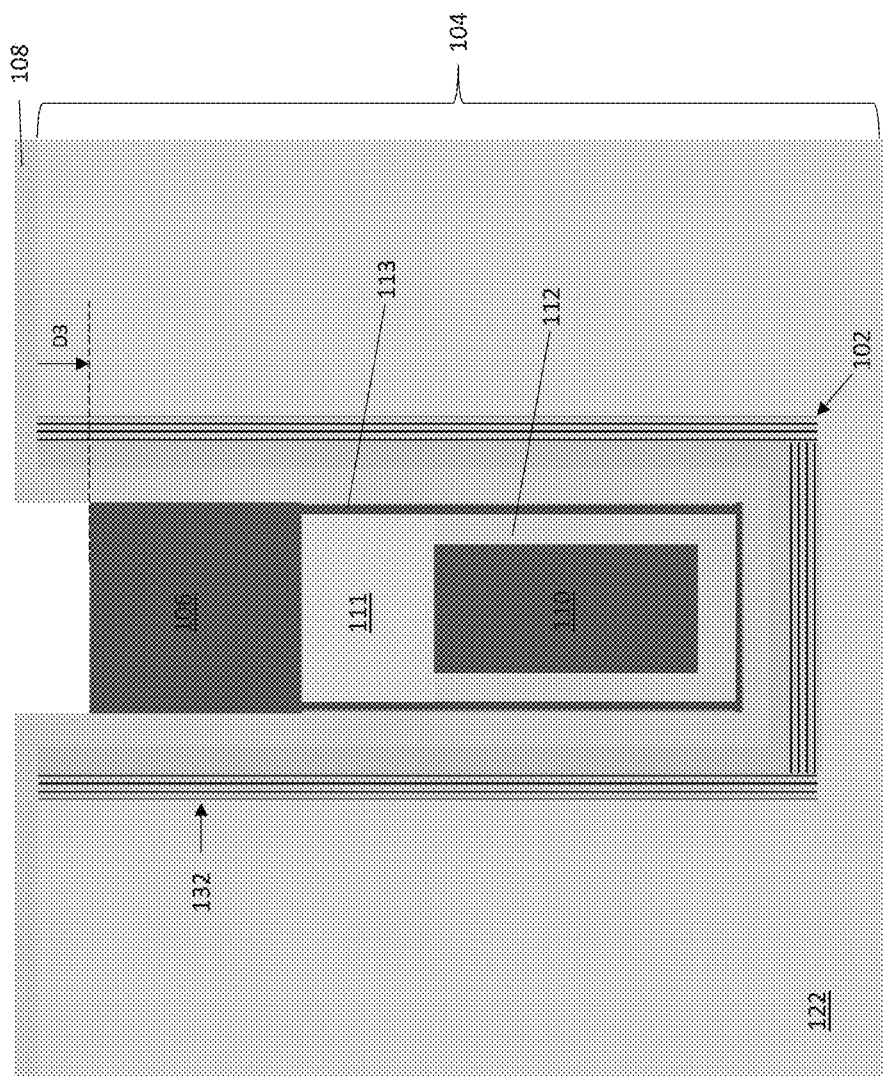

FIG. 2L shows the semiconductor device 100 after the second electrically conductive material 206 is recessed to a third depth D3 in the gate trench 102 to form the gate electrode 106, wherein D3<D2. Any common semiconductor manufacturing process for recessing a gate electrode material in a trench may be used, e.g., such as plasma etching, wet etching, etc.

Figure 2M:
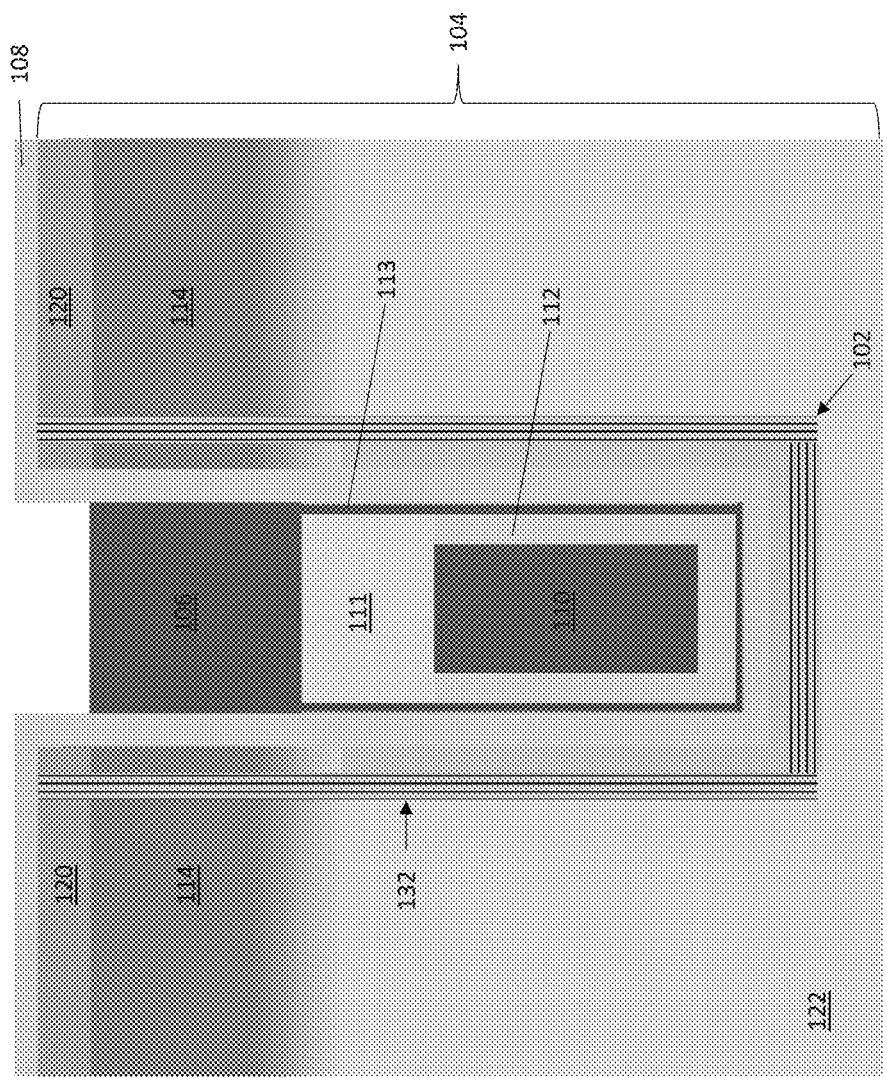

FIG. 2M shows the semiconductor device 100 after dopant species of the opposite conductivity type are implanted into the Si substrate 104 and activated by annealing to form the body and the source regions 114, 120 of the device 100. In the case of an n-channel device, the source dopants may be phosphorus, arsenic, etc. and the body dopants may be boron, gallium, etc. In the case of a p-channel device, the source dopants may be boron, gallium, etc. and the body dopants may be phosphorus, arsenic, etc.

The contact trenches 124 may be formed after implanting the dopant species of the opposite conductivity type into the Si substrate 104 to form the body and the source regions 114, 120 of the device 100. For example, the contact trenches 124 may be etched into the front main surface 130 of the Si substrate 104, implanted through the trench bottom to form a highly doped body contact region 128 at the bottom of the contact trench 124, and then filled with an electrically conductive material 126 which contacts the source region 120 at the sidewall of the contact trench 124 and the highly doped body contact region 128 at the bottom of the contact trench 124, e.g., as shown in FIG. 1.

Figure 3:
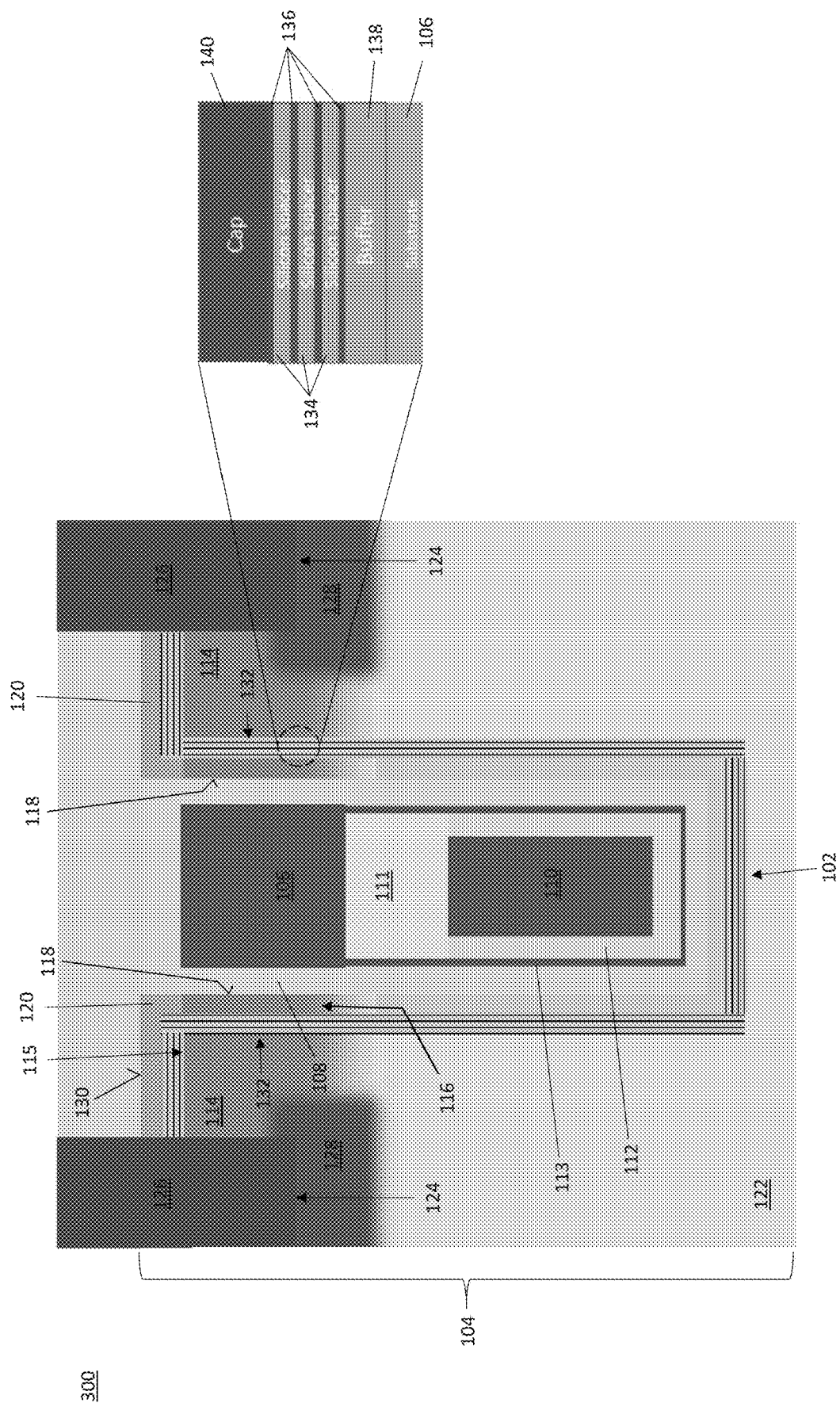
FIG. 3 illustrates a partial cross-sectional view of another embodiment of a trench-based semiconductor device having a diffusion barrier structure.

FIG. 3 illustrates a partial cross-sectional view of another embodiment of a trench-based semiconductor device 300 having a diffusion barrier structure 132 that comprises alternating layers of Si 134 and oxygen-doped Si 136 and a capping layer 140 of Si epitaxially grown on the alternating layers of Si 134 and oxygen-doped Si 136, wherein the channel region 116 of the device 300 is formed in the Si capping layer 140 and vertically extends along the sidewall 118 of the gate trench 102. The embodiment shown in FIG. 3 is similar to the embodiment shown in FIG. 1. Different, however, the diffusion barrier structure 132 of the device 300 shown in FIG. 3 also extends onto the front main surface 130 of the Si substrate 104 into which the gate trench 102 and the contact trench 126 are formed. In one embodiment, the diffusion barrier structure 132 extends along the front main surface 130 of the Si substrate 104 to the electrically conductive material 126 which fills the contact trench 126. The diffusion barrier structure 132 may be formed in this way by removing the mask/insulating material 200 shown in FIG. 2A after etching the gate trench 102 into the Si substrate 104 and before forming the alternating layers of Si 134 and oxygen-doped Si 136. This way, the diffusion barrier structure 132 will also epitaxially grow on the front main surface 130 of the Si substrate 104.

Figure 4:
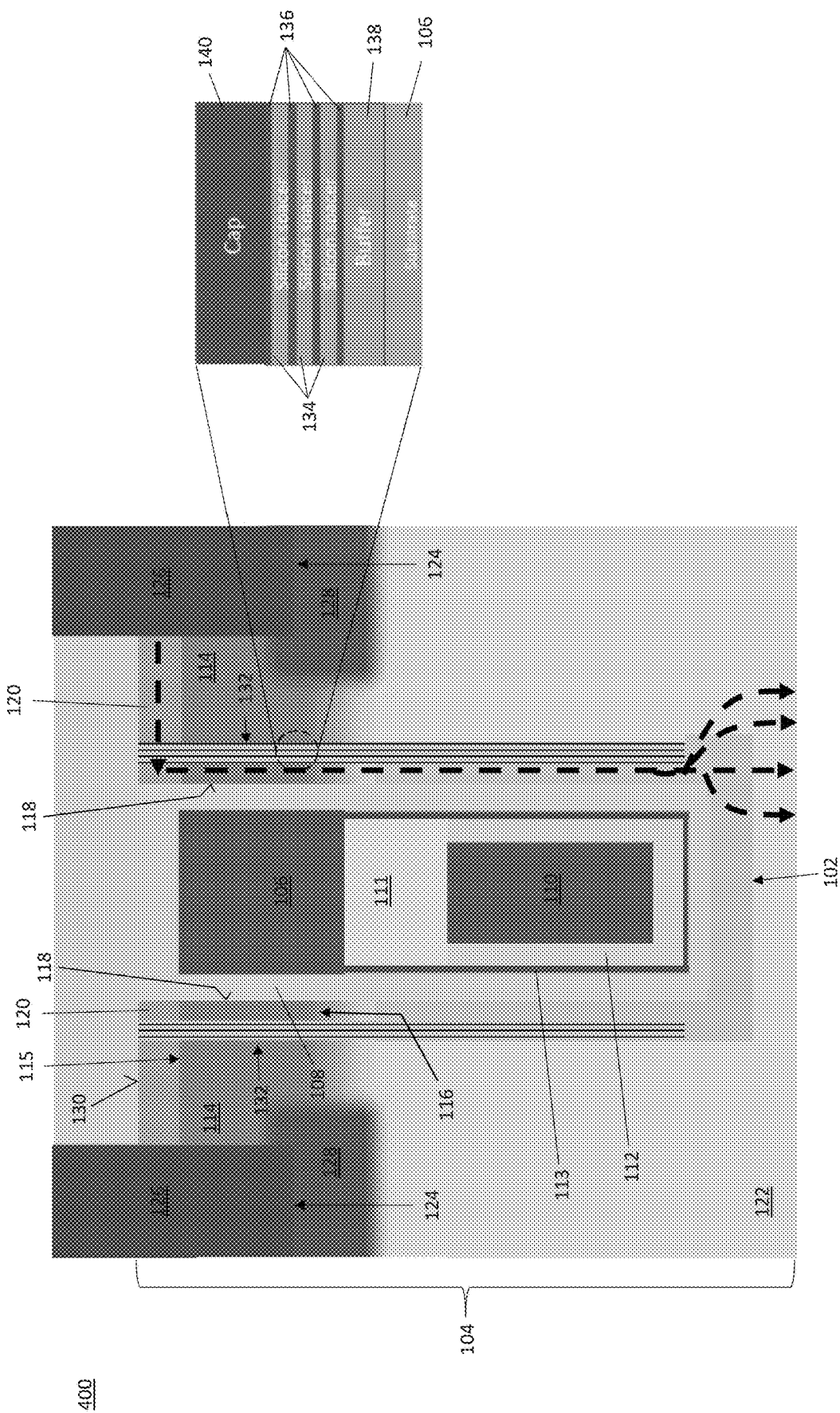
FIG. 4 illustrates a partial cross-sectional view of another embodiment of a trench-based semiconductor device having a diffusion barrier structure.

FIG. 4 illustrates a partial cross-sectional view of another embodiment of a trench-based semiconductor device 400 having a diffusion barrier structure 132 that comprises alternating layers of Si 134 and oxygen-doped Si 136 and a capping layer 140 of Si epitaxially grown on the alternating layers of Si 134 and oxygen-doped Si 136, wherein the channel region 116 of the device 400 is formed in the Si capping layer 140 and vertically extends along the sidewall of the gate trench 102. The embodiment shown in FIG. 4 is similar to the embodiment shown in FIG. 3. Different, however, the Si capping layer 140 of the diffusion barrier structure 132 is present along the bottom of the gate trench 102 but not the alternating layers of Si 134 and oxygen-doped Si 136. Omitting the alternating layers of Si 134 and oxygen-doped Si 136 from the bottom of the gate trench 102 allows current spreading near the bottom of the gate trench 102, as indicated by the dashed arrows in FIG. 4.

FIGS. 5A through 5F illustrate an embodiment of a method of omitting the alternating layers of Si 134 and oxygen-doped Si 136 of the diffusion barrier structure 132 from the bottom of the gate trench 102.

FIG. 5A shows the semiconductor device 400 after formation of the gate trench 102. The gate trench 102 may be etched into the Si substrate 104 using any common trench formation process such as applying a mask/insulating material 200 on the front main surface 130 of the Si substrate 104 and etching the gate trench 102 into the Si substrate 104 through an opening 201 in the mask 200.

Figure 5B:
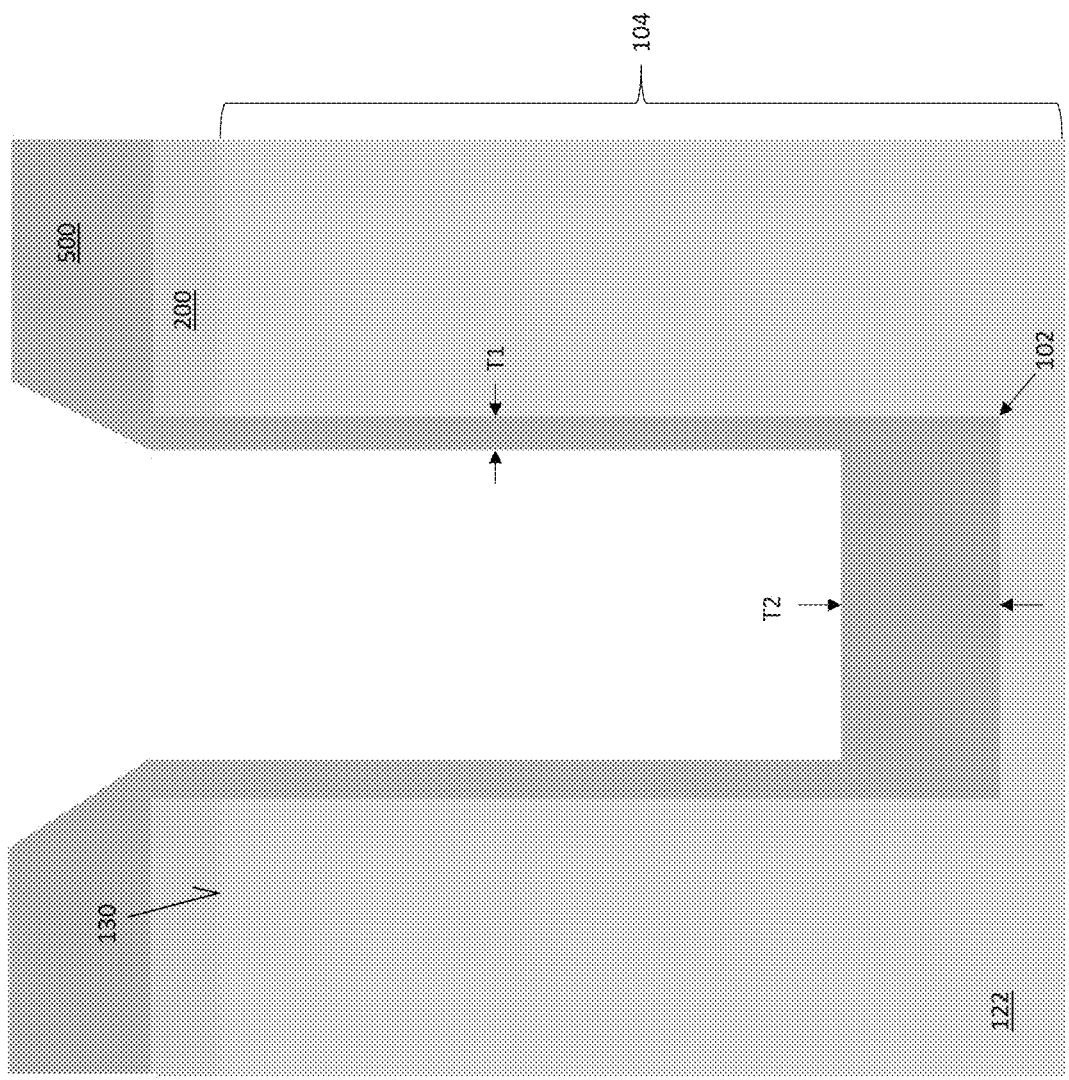

FIG. 5B shows the semiconductor device 400 after an insulating material 500 such as an HDP oxide is formed on the sidewall 118 and bottom of the gate trench 102. In the case of an HDP oxide as the insulating material 500, the HDP oxide may be thinner (T1) along the sidewall 118 and thicker (T2) on the bottom of the gate trench 102.

Figure 5C:
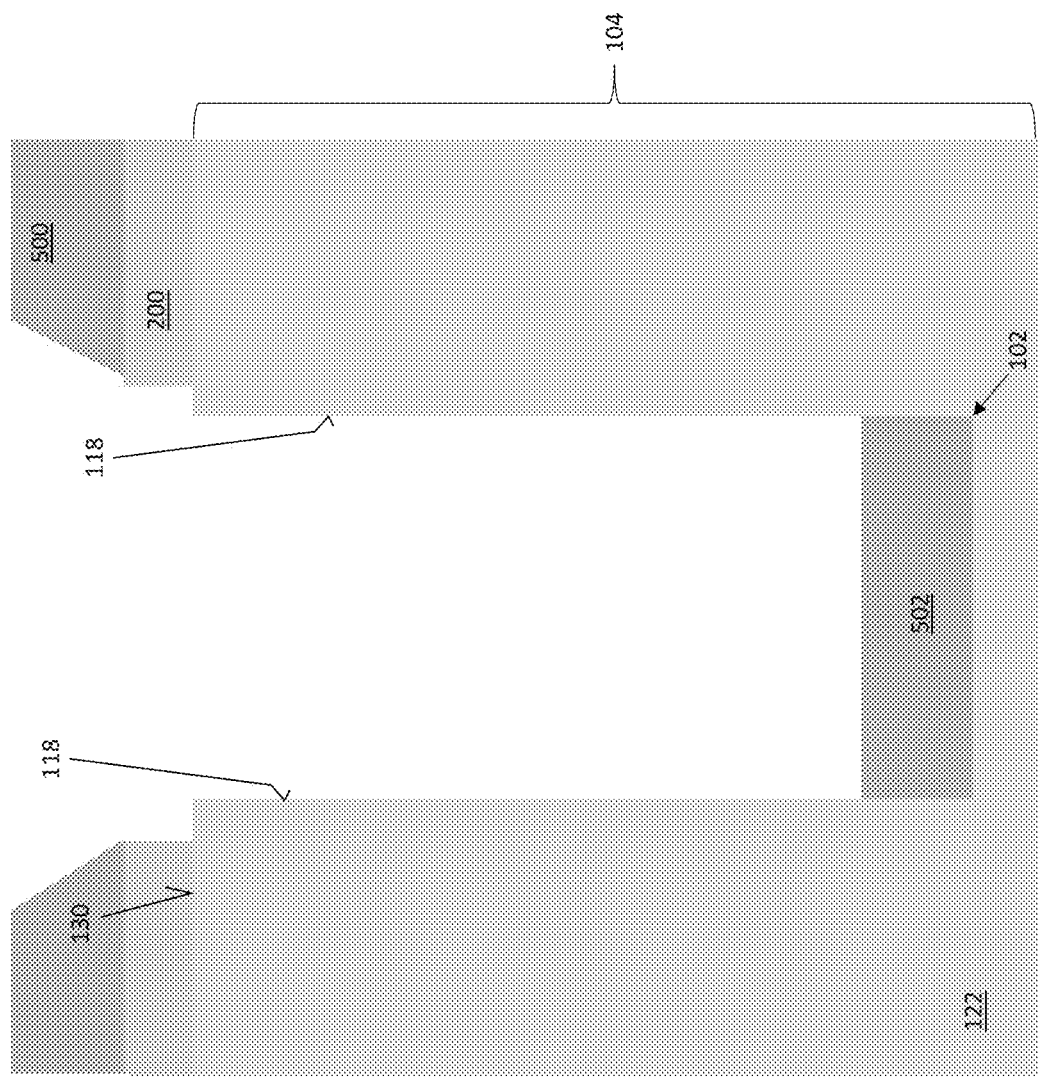

FIG. 5C shows the semiconductor device 400 after the insulating material 500 is removed from the sidewall 118 of the gate trench 102. In the case of an HDP oxide that is thinner along the sidewall 118 and thicker on the bottom of the gate trench 102, the HDP oxide will be removed from the sidewall 118 of the gate trench 102 before being completely removed from the trench bottom. The part of the HDP oxide that remains in the bottom of the gate trench 102 forms an insulating spacer 502 in the lower part of the gate trench 102. The insulating spacer 502 covers the bottom and a lower part of the sidewall 118 of the gate trench 102 to prevent formation of the alternating layers of Si 134 and oxygen-doped Si 136 of the diffusion barrier structure 132 on the bottom and the lower part of the sidewall 118 of the gate trench 102.

Figure 5D:
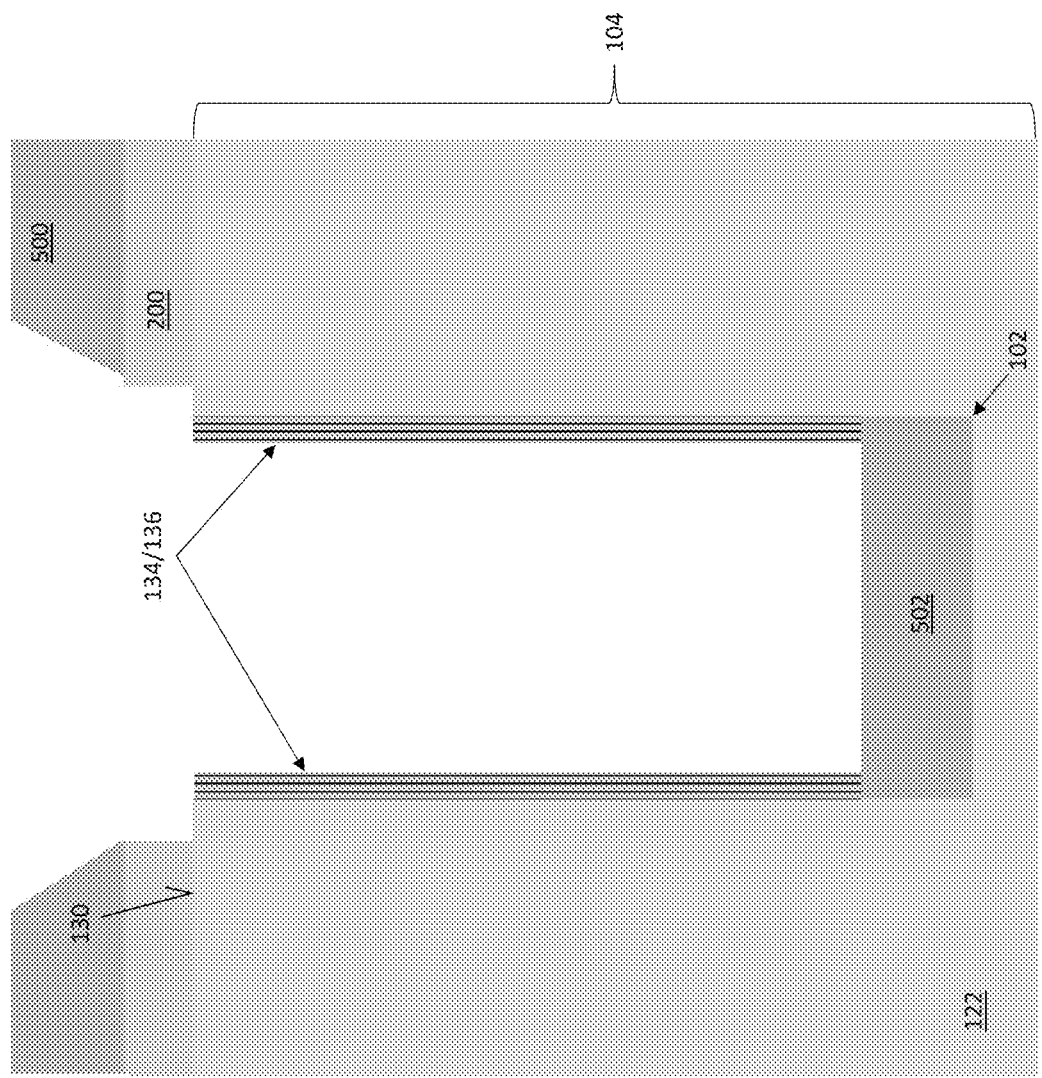

FIG. 5D shows the semiconductor device 400 after epitaxially growing the alternating layers of Si 134 and oxygen-doped Si 136 on the exposed sidewall 118 of the gate trench 102.

FIG. 5E shows the semiconductor device 400 after the insulating spacer 502 is removed from the bottom of the gate trench 102, and after removal of any remnants of the insulating material 500 and of the mask/insulating material 200 from the front main surface 130 of the Si substrate 104. The lower part 504 of the sidewall 118 of the gate trench 102 and the bottom 506 of the gate trench 102 are exposed by removing the insulating spacer 502.

Figure 5F:
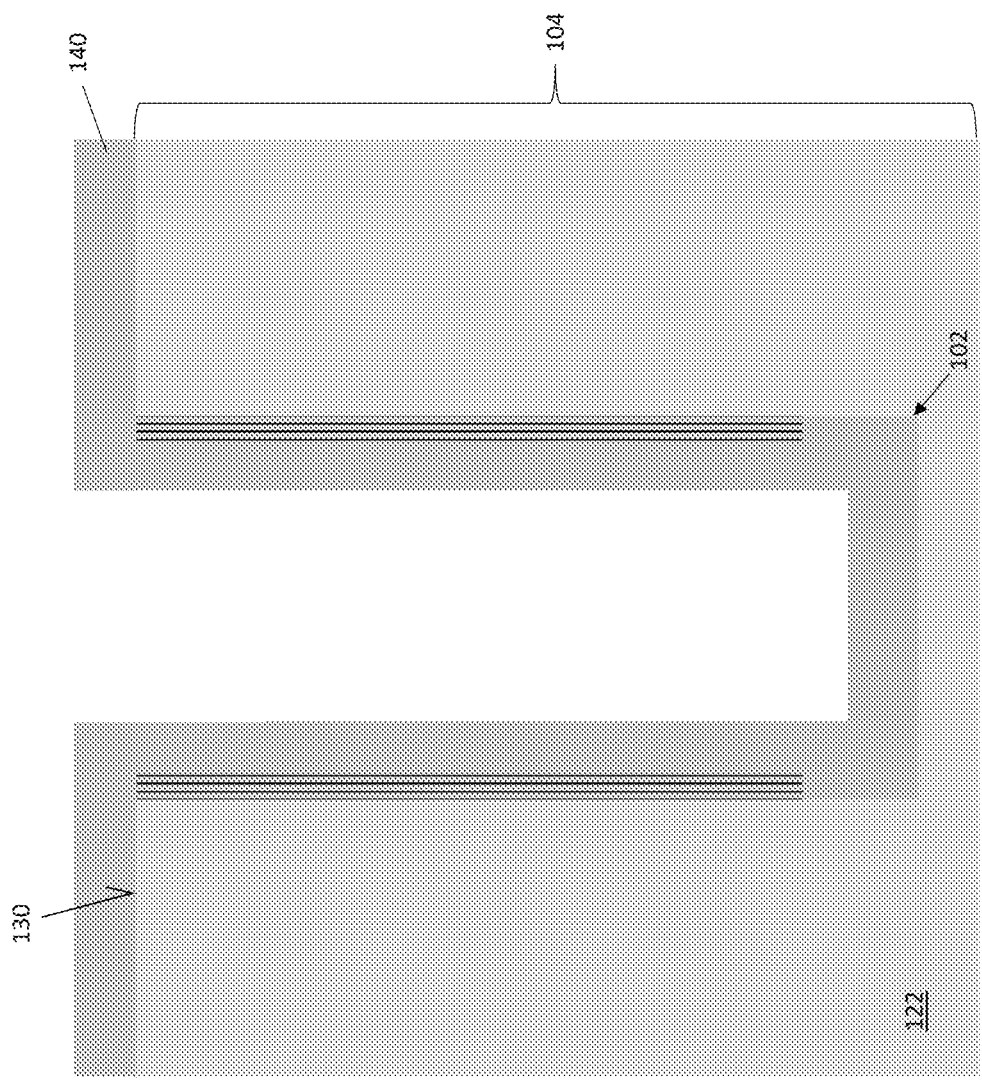

FIG. 5F shows the semiconductor device 400 after the Si capping layer 140 of the diffusion structure 132 is epitaxially grown on the front main surface 130 of the Si substrate 104, on the alternating layers of Si 134 and oxygen-doped Si 136, on the exposed lower part 504 of the sidewall 118 of the gate trench 102, and on the exposed bottom 506 of the gate trench 102. Device processing continues, e.g., as shown in FIGS. 2D through 2M and as previously described herein, to complete the device 400 shown in FIG. 4.

FIGS. 6A through 6H illustrate another embodiment of a method of omitting the alternating layers of Si 134 and oxygen-doped Si 136 of the diffusion barrier structure 132 from the bottom of the gate trench 102.

FIG. 6A shows the semiconductor device 400 after formation of the gate trench 102. The gate trench 102 may be etched into the Si substrate 104 using any common trench formation process such as applying a mask/insulating material 200 on the front main surface 130 of the Si substrate 104 and etching the gate trench 102 into the Si substrate 104 through an opening 201 in the mask 200.

Figure 6B:
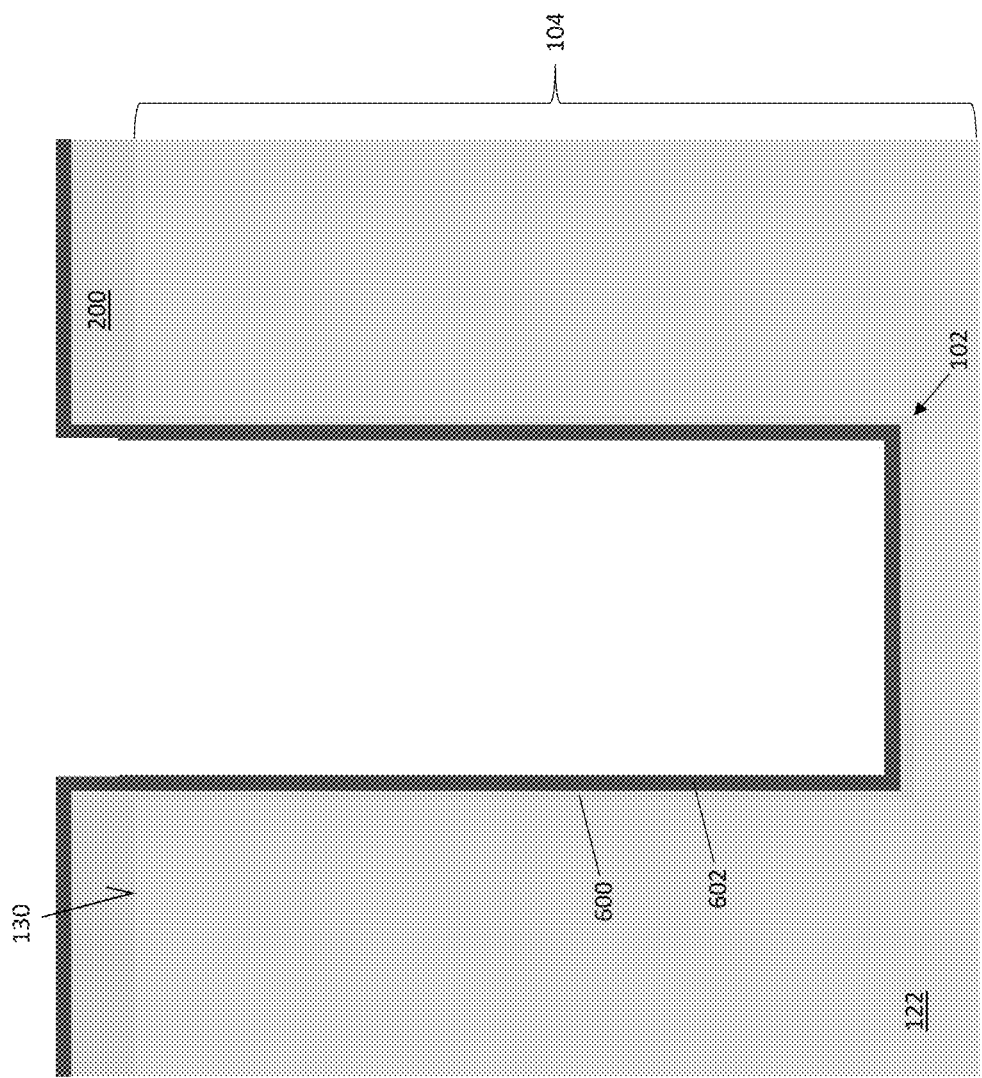

FIG. 6B shows the semiconductor device 400 after an oxide layer 600 is formed on the sidewall 118 and bottom of the gate trench 102, e.g., by deposition, thermal oxidation, or a combination of both, and after a silicon nitride layer 602 is formed on the oxide layer 600 over the sidewall 118 and bottom of the gate trench 102.

FIG. 6C shows the semiconductor device 400 after an opening 604 is formed in the silicon nitride layer 602 at the bottom of the gate trench 102, e.g., by anisotropic plasma etching, to expose the silicon oxide layer 600 at the trench bottom.

FIG. 6D shows the semiconductor device 400 after thermally oxidizing a region of the Si substrate 104 below the exposed silicon oxide layer 600 at the bottom of the gate trench 102. The thermal oxidation process yields an insulating spacer 606 in the lower part of the gate trench 102. The insulating spacer 606 covers the bottom and a lower part of the sidewall 118 of the gate trench 102 to prevent formation of the alternating layers of Si 134 and oxygen-doped Si 136 of the diffusion barrier structure 132 on the bottom and the lower part of the sidewall 118 of the gate trench 102.

Figure 6E:
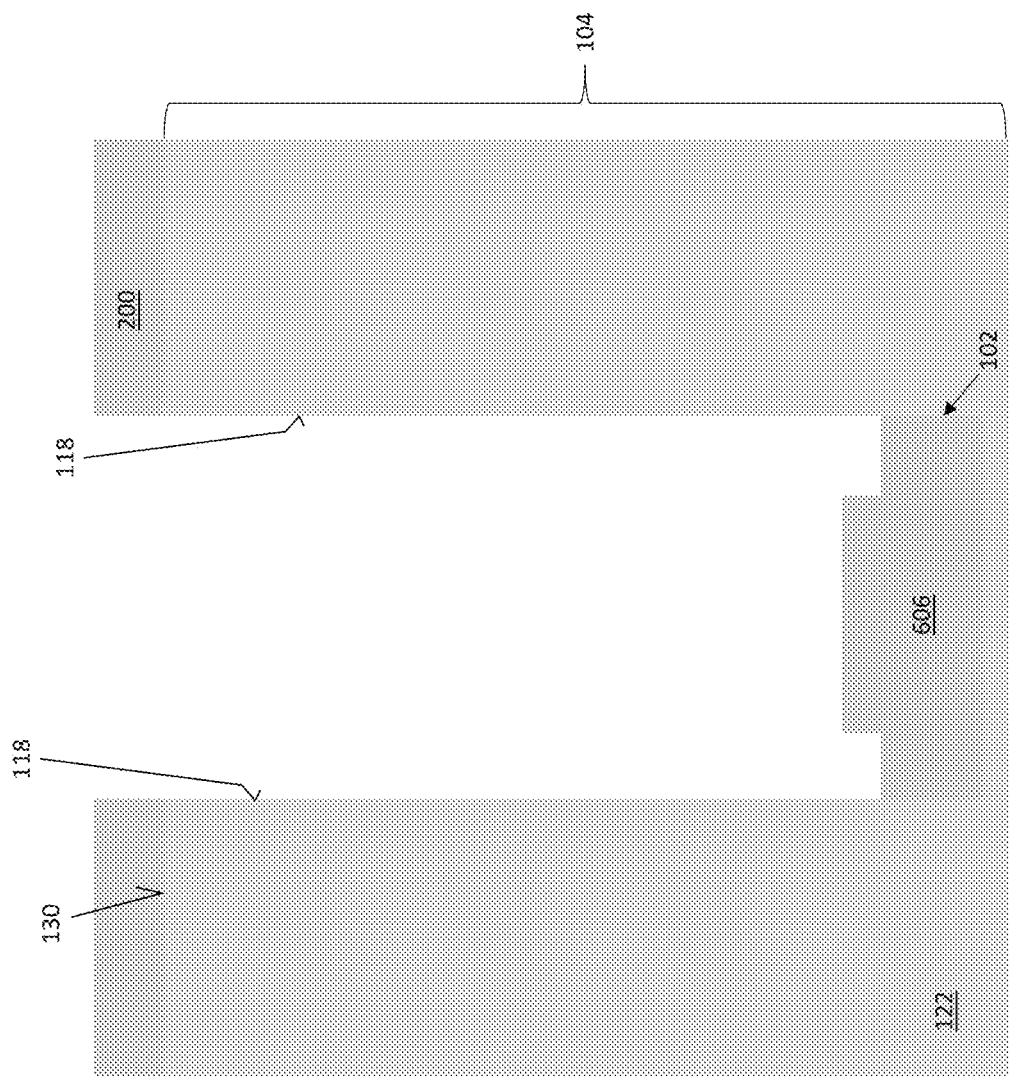

FIG. 6E shows the semiconductor device 400 after the silicon nitride layer 602 and the silicon oxide layer 600 are removed from the sidewall 118 of the gate trench 102.

FIG. 6F shows the semiconductor device 400 after epitaxially growing the alternating layers of Si and oxygen-doped Si on the exposed sidewall 118 of the gate trench 102.

FIG. 6G shows the semiconductor device 400 after the insulating spacer 606 is removed from the bottom of the gate trench 102, and after removal of any remnants of the mask/insulating material 200 from the front main surface 130 of the Si substrate 104. The lower part 608 of the sidewall 118 of the gate trench 102 and the bottom 610 of the gate trench 102 are exposed by removing the insulating spacer 606.

Figure 6H:
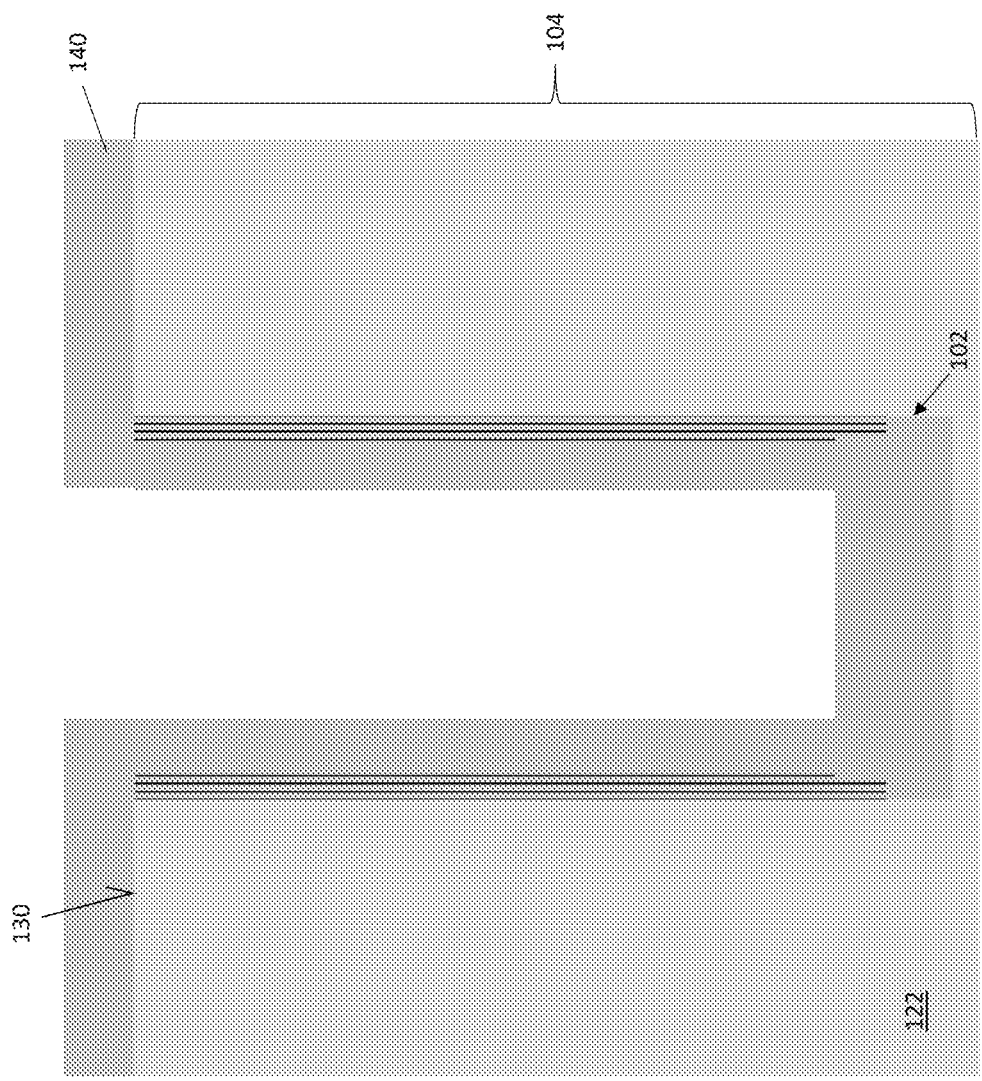

FIG. 6H shows the semiconductor device 400 after the Si capping layer 140 of the diffusion structure 132 is epitaxially grown on the front main surface 130 of the Si substrate 104, on the alternating layers of Si 134 and oxygen-doped Si 136, on the exposed lower part 608 of the sidewall 118 of the gate trench 102, and on the exposed bottom 610 of the gate trench 102. Device processing continues, e.g., as shown in FIGS. 2D through 2M and as previously described herein, to complete the device 400 shown in FIG. 4.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a gate trench extending into a Si substrate;
   a body region in the Si substrate adjacent the gate trench;
   a source region in the Si substrate above the body region;
   a diffusion barrier structure adjacent a sidewall of the gate trench, the diffusion barrier structure comprising alternating layers of Si and oxygen-doped Si and a Si capping layer on the alternating layers of Si and oxygen-doped Si; and
   a channel region formed in the Si capping layer and which vertically extends along the sidewall of the gate trench.

2. The semiconductor device of claim 1, wherein the diffusion barrier structure extends onto a front main surface of the Si substrate into which the gate trench is formed.

3. The semiconductor device of claim 1, wherein the Si capping layer of the diffusion barrier structure is present along a bottom of the gate trench but not the alternating layers of Si and oxygen-doped Si.

4. The semiconductor device of claim 1, wherein the gate trench comprises a gate dielectric lining the sidewall and a bottom of the gate trench, a gate electrode disposed in an upper part of the gate trench, a field electrode embedded in a field dielectric in a lower part of the gate trench below the gate electrode, an insulating spacer vertically separating the gate electrode from the field electrode, and a silicon nitride layer separating the insulating spacer and the field dielectric from the gate dielectric.

5. A method of manufacturing a semiconductor device, the method comprising:
   forming a gate trench which extends into a Si substrate;
   forming a body region in the Si substrate adjacent the gate trench;
   forming a source region in the Si substrate above the body region;
   forming a diffusion barrier structure along a sidewall of the gate trench, the diffusion barrier structure comprising alternating layers of Si and oxygen-doped Si and a Si capping layer on the alternating layers of Si and oxygen-doped Si; and
   forming a channel region in the Si capping layer and which vertically extends along the sidewall of the gate trench.

6. The method of claim 5, wherein forming the diffusion barrier structure comprises:
   epitaxially growing the alternating layers of Si and oxygen-doped Si on the sidewall and a bottom of the gate trench; and
   epitaxially growing the Si capping layer on the alternating layers of Si and oxygen-doped Si.

7. The method of claim 6, further comprising:
   epitaxially growing the alternating layers of Si and oxygen-doped Si and the Si capping layer on a front main surface of the Si substrate into which the gate trench is formed.

8. The method of claim 6, further comprising:
   forming a gate dielectric on the Si capping layer.

9. The method of claim 8, further comprising:
   forming a silicon nitride layer on the gate dielectric;
   forming a field dielectric on the silicon nitride layer;
   after forming the field dielectric, filling the gate trench with a first electrically conductive material; and
   recessing the first electrically conductive material to a first depth in the gate trench to form a field electrode.

10. The method of claim 9, further comprising:
    removing the field dielectric above the field electrode to expose the silicon nitride layer in a region of the gate trench above the field electrode; and
    after removing the field dielectric above the field electrode, covering the field electrode with an insulating spacer.

11. The method of claim 10, wherein covering the field electrode with the insulating spacer comprises:
    after removing the field oxide above the field electrode, filling the gate trench with a dielectric material; and
    recessing the dielectric material to a second depth in the gate trench above the field electrode.

12. The method of claim 11, wherein filling the gate trench with the dielectric material comprises:
    depositing a high-density-plasma oxide in the gate trench by chemical vapor deposition.

13. The method of claim 11, wherein covering the field electrode with the insulating spacer comprises:
    forming a thermal oxide on the field electrode by a thermal oxidation process.

14. The method of claim 10, further comprising:
    removing the silicon nitride layer above the insulating spacer;
    after removing the silicon nitride layer above the insulating spacer, filling the gate trench with a second electrically conductive material; and
    recessing the second electrically conductive material to a third depth in the gate trench to form a gate electrode.

15. The method of claim 14, further comprising:
    after forming the gate electrode, implanting dopant species of the opposite conductivity type into the Si substrate to form the body region and the source region.

16. The method of claim 10, further comprising:
    removing the silicon nitride layer above the insulating spacer;
    after removing the silicon nitride layer above the insulating spacer, filling the gate trench with a second electrically conductive material; and
    recessing the second electrically conductive material to a third depth in the gate trench to form a gate electrode.

17. The method of claim 10, further comprising:
    before forming the alternating layers of Si and oxygen-doped Si of the diffusion barrier structure, forming an insulating spacer in a lower part of the gate trench, the insulating spacer covering a bottom and a lower part of the sidewall of the gate trench to prevent formation of the alternating layers of Si and oxygen-doped Si of the diffusion barrier structure on the bottom and the lower part of the sidewall of the gate trench; and after forming the alternating layers of Si and oxygen-doped Si of the diffusion barrier structure, removing the insulating spacer from the lower part of the gate trench.

18. The method of claim 17, further comprising:

after removing the insulating spacer from the lower part of the gate trench, epitaxially growing the Si capping layer of the diffusion barrier structure on the alternating layers of Si and oxygen-doped Si and on the bottom and the lower part of the sidewall of the gate trench.

19. The method of claim 17, wherein forming the insulating spacer in the lower part of the gate trench comprises:

forming a high-density plasma oxide on the sidewall and the bottom of the gate trench, the high-density plasma oxide being thinner along the sidewall and thicker on the bottom of the gate trench; and removing the high-density plasma oxide from the sidewall of the gate trench.

20. The method of claim 17, wherein forming the insulating spacer in the lower part of the gate trench comprises:

forming a silicon oxide layer on the sidewall and the bottom of the gate trench;

forming a silicon nitride layer on the silicon oxide layer over the sidewall and the bottom of the gate trench;

forming an opening in the silicon nitride layer at the bottom of the gate trench to expose the silicon oxide layer at the bottom of the gate trench;

thermally oxidizing a region of the Si substrate below the exposed silicon oxide layer at the bottom of the gate trench; and removing the silicon nitride layer and the silicon oxide layer from the sidewall of the gate trench.

\* \* \* \* \*